(12) United States Patent
Saito et al.

(10) Patent No.: US 8,637,864 B2
(45) Date of Patent: Jan. 28, 2014

(54) SEMICONDUCTOR DEVICE AND METHOD OF MANUFACTURING THE SAME

(71) Applicant: Semiconductor Energy Laboratory Co., Ltd., Atsugi (JP)

(72) Inventors: Toshihiko Saito, Atsugi (JP); Atsuo Isobe, Isehara (JP); Kazuya Hanaoka, Fujisawa (JP); Junichi Koezuka, Tochigi (JP); Shinya Sasagawa, Chigasaki (JP); Motomu Kurata, Isehara (JP); Akihiro Ishizuka, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/632,635

(22) Filed: Oct. 1, 2012

(65) Prior Publication Data

US 2013/0092925 A1    Apr. 18, 2013

(30) Foreign Application Priority Data

Oct. 13, 2011    (JP) .................................. 2011-226135

(51) Int. Cl.
*H01L 29/12*    (2006.01)

(52) U.S. Cl.
USPC .................. 257/43; 257/E29.296; 257/57

(58) Field of Classification Search
USPC ............... 257/43, 57, E29.296; 438/104, 151
See application file for complete search history.

(56) References Cited

U.S. PATENT DOCUMENTS

| | | | |
|---|---|---|---|
| 5,528,032 A | 6/1996 | Uchiyama | |
| 5,731,856 A | 3/1998 | Kim et al. | |
| 5,744,864 A | 4/1998 | Cillessen et al. | |
| 6,242,343 B1 | 6/2001 | Yamazaki et al. | |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Morosawa.N. et al., "35.3: Distinguished Paper: A Novel Self-Aligned Top-Gate Oxide TFT for AM-OLED Displays,", SID Digest '11 : SID International Symposium Digest of Technical Papers, May 17, 2011, pp. 479-482.

(Continued)

*Primary Examiner* — Calvin Lee
*Assistant Examiner* — Scott Stowe
(74) *Attorney, Agent, or Firm* — Eric J. Robinson; Robinson Intellectual Property Law Office, P.C.

(57) ABSTRACT

A miniaturized transistor is provided with high yield. Further, a semiconductor device which has high on-state characteristics and which is capable of high-speed response and high-speed operation is provided. In the semiconductor device, an oxide semiconductor layer, a gate insulating layer, a gate electrode layer, an insulating layer, a conductive film, and an interlayer insulating layer are stacked in this order. A source electrode layer and a drain electrode layer are formed in a self-aligned manner by cutting the conductive film so that the conductive film over the gate electrode layer and the conductive layer is removed and the conductive film is divided. An electrode layer which is in contact with the oxide semiconductor layer and overlaps with a region in contact with the source electrode layer and the drain electrode layer is provided.

18 Claims, 17 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,910,490 B2 | 3/2011 | Akimoto et al. |
| 7,932,521 B2 | 4/2011 | Akimoto et al. |
| 8,003,981 B2 | 8/2011 | Iwasaki et al. |
| 8,164,090 B2 | 4/2012 | Iwasaki et al. |
| 8,207,025 B2 | 6/2012 | Suzawa et al. |
| 8,247,813 B2 | 8/2012 | Koyama et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2011/0089417 A1 | 4/2011 | Yamazaki et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0122670 A1 | 5/2011 | Yamazaki et al. |
| 2011/0136301 A1 | 6/2011 | Yamazaki et al. |
| 2011/0136302 A1 | 6/2011 | Yamazaki et al. |
| 2011/0163311 A1 | 7/2011 | Akimoto et al. |
| 2011/0175087 A1 | 7/2011 | Yamazaki et al. |
| 2011/0204362 A1 | 8/2011 | Akimoto et al. |
| 2011/0212569 A1 | 9/2011 | Yamazaki et al. |
| 2011/0212570 A1 | 9/2011 | Yamazaki et al. |
| 2011/0250724 A1 | 10/2011 | Suzawa et al. |
| 2011/0260171 A1 | 10/2011 | Yamazaki |
| 2011/0263082 A1 | 10/2011 | Yamazaki |
| 2011/0263083 A1 | 10/2011 | Yamazaki |
| 2011/0263084 A1 | 10/2011 | Yamazaki |
| 2011/0263085 A1 | 10/2011 | Yamazaki |
| 2011/0263091 A1 | 10/2011 | Yamazaki |
| 2011/0269266 A1 | 11/2011 | Yamazaki |
| 2012/0018727 A1 | 1/2012 | Endo et al. |
| 2012/0032161 A1 | 2/2012 | Matsubayashi |
| 2012/0034743 A1 | 2/2012 | Suzawa et al. |
| 2012/0061670 A1 | 3/2012 | Suzawa et al. |
| 2012/0112184 A1 | 5/2012 | Yamazaki et al. |
| 2012/0146019 A1 | 6/2012 | Yamazaki et al. |
| 2012/0149147 A1 | 6/2012 | Yamazaki et al. |
| 2012/0161121 A1 | 6/2012 | Yamazaki |
| 2012/0161123 A1 | 6/2012 | Yamazaki |
| 2012/0161124 A1 | 6/2012 | Yamazaki |
| 2012/0161126 A1 | 6/2012 | Yamazaki |
| 2012/0187397 A1 | 7/2012 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-074526 | 3/1999 |
| JP | 11-505377 | 5/1999 |
| JP | 2000-044236 A | 2/2000 |
| JP | 2000-150900 A | 5/2000 |

(56) References Cited

FOREIGN PATENT DOCUMENTS

| JP | 2002-076356 | A | 3/2002 |
|---|---|---|---|
| JP | 2002-289859 | A | 10/2002 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| JP | 2006-165528 | | 6/2006 |
| JP | 2007-096055 | A | 4/2007 |
| JP | 2009-224479 | A | 10/2009 |
| WO | WO-2004/114391 | | 12/2004 |

OTHER PUBLICATIONS

Specification, claims as filed, abstract, drawings, Official Filing Receipt of U.S. Appl. No. 13/604,962, filed Sep. 6, 2012 (not published).

Specification, claims as filed, abstract, drawings, Official Filing Receipt of U.S. Appl. No. 13/461,808, filed May 2, 2012 (not published).

Specification, claims as filed, abstract, drawings, Official Filing Receipt of U.S. Appl. No. 13/608,039, filed Sep. 10, 2012 (not published).

Specification, claims as filed, abstract, drawings, Official Filing Receipt of U.S. Appl. No. 13/608,042, filed Sep. 10, 2012 (not published).

Specification, claims as filed, abstract, drawings, Official Filing Receipt of U.S. Appl. No. 13/608,044, filed Sep. 10, 2012 (not published).

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the $In_2O_3$-$Ga_2ZnO_4$-ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m = 3, 4, and 5), $InGaO_3(ZnO)_3$, and $Ga_2O_3(ZnO)_m$ (m =7, 8, 9, and 16) in the $In_2O_3$-$ZnGa_2O_4$-ZnO system,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applies Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)_m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$-$In_2O_3$-ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 38, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5Δ) Flexible Full Color Top Emission AMOLED Display on Plastic Film and Its Bending Properties,", SID Digest '09 : SID International Symposium Digest of Technical Papers, May 31, 2009, pp. 983-985.

(56) References Cited

OTHER PUBLICATIONS

Sakata.J et al., "Development of 4.0-In. AMOLED Display With Driver Circuit Using Amorphous In-Ga-Zn-Oxide TFTs,", IDW '09 : Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In-Ga-Zn-Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "SPINEL,YbFe2O4, and Yb2Fe3O7 Types of Structures for Compounds in the In2O3 and Sc2O3-A2O3-BO Systems [A; Fe, Ga, Or Al; B: Mg, Mn, Fe, Ni, Cu, Or Zn]) at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A. (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

SEMICONDUCTOR DEVICE AND METHOD OF MANUFACTURING THE SAME

BACKGROUND OF THE INVENTION

1. Field of the Invention

One embodiment of the present invention relates to a semiconductor device and a method for manufacturing the semiconductor device.

2. Description of the Related Art

Attention has been focused on a technique for forming a transistor using a thin semiconductor film formed over a substrate having an insulating surface (also referred to as a thin film transistor (TFT)).

For example, a transistor whose active layer includes an amorphous oxide including indium (In), gallium (Ga), and zinc (Zn) is disclosed (see Patent Document 1).

REFERENCE

Patent Document

[Patent Document 1] Japanese Published Patent Application No. 2006-165528

SUMMARY OF THE INVENTION

It is necessary to miniaturize the transistor in order to achieve high-speed operation, low power consumption, or high integration of the transistor.

However, as the transistor is miniaturized, concern about a decrease in yield of a manufacturing process rises. Therefore, an object is to provide a miniaturized transistor with high yield.

Further, an improvement in on-state characteristics of a miniaturized transistor is required with an improvement in performance of a semiconductor device including the transistor. Therefore, another object is to provide a structure of a miniaturized transistor which is capable of high-speed response and high-speed operation and a method for manufacturing the transistor.

SUMMARY OF THE INVENTION

In a semiconductor device of one embodiment of the present invention, a conductive film and an interlayer insulating layer are stacked in this order over an oxide semiconductor layer, a gate insulating layer over the oxide semiconductor layer, a gate electrode layer over the gate insulating layer, and an insulating layer over the gate electrode layer. A source electrode layer and a drain electrode layer are formed in a self-aligned manner by cutting the conductive film so that the conductive film over the gate electrode layer and the insulating layer is removed and the conductive film is divided. The oxide semiconductor layer includes low-resistance regions whose resistance is lowered by introduction of an impurity element and a channel formation region. The oxide semiconductor layer is in contact with the source electrode layer and the drain electrode layer in the low-resistance regions. An electrode layer formed using metal, a conductive metal compound, a semiconductor, or the like is provided under and in contact with the low-resistance regions.

Precise processing can be performed accurately because an etching step using a resist mask is not performed in a step for forming the source electrode layer and the drain electrode layer. Consequently, in a process for manufacturing the semiconductor device, the transistor having a miniaturized structure with less variation in shape or characteristics can be manufactured with high yield.

The low-resistance regions of the oxide semiconductor layer are in contact with the source electrode layer and the drain electrode layer, and function as a source region and a drain region. Accordingly, the contact resistance between the oxide semiconductor layer and each of the source and drain electrode layers is reduced. When electrode layers are provided under and in contact with the low-resistance regions, the electrode layers also function as a source region and a drain region; thus, the thickness of the source region and the drain region can be increased. When the thickness of the source region and the drain region are increased, the resistances of the source region and the drain region are reduced and electric fields in the source electrode layer and the drain electrode layer are relaxed; consequently, a semiconductor device which has excellent on-state characteristics can be provided.

In view of the above, one embodiment of the present invention is a semiconductor device including a pair of electrode layers; an oxide semiconductor layer which is over the pair of electrode layers and includes a pair of low-resistance regions in contact with the pair of electrode layers and a channel formation region sandwiched between the pair of low-resistance regions; a gate insulating layer over the oxide semiconductor layer; a gate electrode layer which is over the gate insulating layer and overlaps with the channel formation region; an upper insulating layer over the gate electrode layer; sidewall insulating layers covering side surfaces of the gate electrode layer and side surfaces of the upper insulating layer; a source electrode layer and a drain electrode layer in contact with the oxide semiconductor layer, side surfaces of the gate insulating layer, and side surfaces of the sidewall insulating layer; a first insulating layer over the source electrode layer and the drain electrode layer; a second insulating layer over the upper insulating layer, the sidewall insulating layers, the source electrode layer, and the drain electrode layer; and a pair of wiring layers in contact with the source electrode layer and the drain electrode layer through openings provided in the first insulating layer and the second insulating layer. The heights of top surfaces of the source electrode layer and the drain electrode layer are lower than the heights of top surfaces of the upper insulating layer, the sidewall insulating layers, and the first insulating layer, and higher than the height of a top surface of the gate electrode layer. The pair of wiring layers overlaps with the pair of electrode layers.

Further, in the semiconductor device, the electrode layers are provided in or over the base insulating layer under the oxide semiconductor layer, and top surfaces of the electrode layers are exposed from the base insulating layer or each have the same height as a top surface of the base insulating layer and a top surface of the electrode layer. In that case, the thickness of the electrode layers can be greater than the thickness of the oxide semiconductor layer, so that the source region and the drain region can be thicker.

Alternatively, the electrode layers may be formed over the base insulating layer so that the oxide semiconductor layer is formed over the electrode layers. The number of steps for forming the semiconductor device can be reduced in that case.

Further, the first insulating layer preferably includes an aluminum oxide layer in contact with the source electrode layer and the drain electrode layer.

Further, a surface on which the channel formation region is to be formed preferably has planarity.

Another embodiment of the present invention is a method for manufacturing a semiconductor device including the following steps: forming a pair of electrode layers; forming an oxide semiconductor layer over the pair of electrode layers; forming a gate insulating layer over the oxide semiconductor layer; forming a gate electrode layer and an upper insulating layer over the gate insulating layer to overlap with the oxide semiconductor layer; introducing an impurity element into the oxide semiconductor layer using the gate electrode layer and the upper insulating layer as masks so that a pair of low-resistance regions and a channel formation region are formed in a self-aligned manner; forming sidewall insulating layers over the gate insulating layer to cover side surfaces of the gate electrode layer; forming a conductive film over the oxide semiconductor layer, the gate electrode layer, the sidewall insulating layers, and the upper insulating layer; forming an interlayer insulating layer over the conductive film; forming a source electrode layer and a drain electrode layer by removing the interlayer insulating layer and the conductive film by a chemical mechanical polishing method until the upper insulating layer is exposed so that the conductive film is divided; and forming a second insulating layer over the first insulating layer, the upper insulating layer, the source electrode layer, and the drain electrode layer. Further, openings reaching the source electrode layer and the drain electrode layer may be formed in the first insulating layer and the second insulating layer, and wiring layers in contact with the source electrode layer and the drain electrode layer through the openings may be formed.

Note that in this specification and the like, the term such as "over" does not necessarily mean that a component is placed "directly on" another component. For example, the expression "a gate electrode layer over an insulating layer" does not exclude the case where there is an additional component between the insulating layer and the gate electrode layer. The same applies to the term "under".

In this specification and the like, the term "electrode layer" or "wiring layer" does not limit the function of components. For example, an "electrode layer" can be used as part of a "wiring layer", and the "wiring layer" can be used as part of the "electrode layer". In addition, the term "electrode layer" or "wiring layer" can also mean a combination of a plurality of "electrode layers" and "wiring layers", for example.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification.

Note that in this specification and the like, the term "electrically connected" includes the case where components are connected through an object having any electric function. There is no particular limitation on an object having any electric function as long as electric signals can be transmitted and received between components that are connected through the object.

Examples of an "object having any electric function" include an electrode and a wiring.

One embodiment of the present invention can provide a miniaturized transistor with high yield. Further, another embodiment of the present invention can provide a structure of a miniaturized transistor which has high on-state characteristics and which is capable of high-speed response and high-speed operation and a method for manufacturing the transistor.

DETAILED DESCRIPTION OF THE INVENTION

Figure 1A:
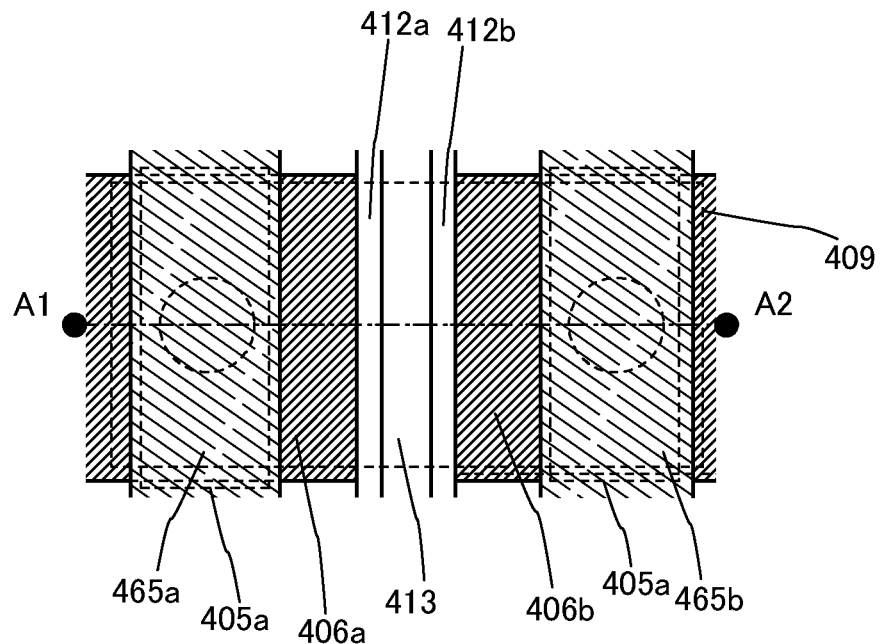
FIGS. 1A and 1B are a top view and a cross-sectional view, respectively, illustrating a semiconductor device of one embodiment of the present invention.

Hereinafter, embodiments of the present invention are described in detail with reference to the accompanying drawings. However, the present invention is not limited to the description below, and it is easily understood by those skilled in the art that modes and details thereof can be modified in various ways. Therefore, the present invention is not construed as being limited to description of the embodiments.

In embodiments hereinafter described, the same parts are denoted with the same reference numerals throughout the drawings. The thickness, width, relative relation of position, and the like of a layer, a region, or the like illustrated in the drawings are exaggerated for clarification of description of the embodiments in some cases.

(Embodiment 1)

Figure 1B:
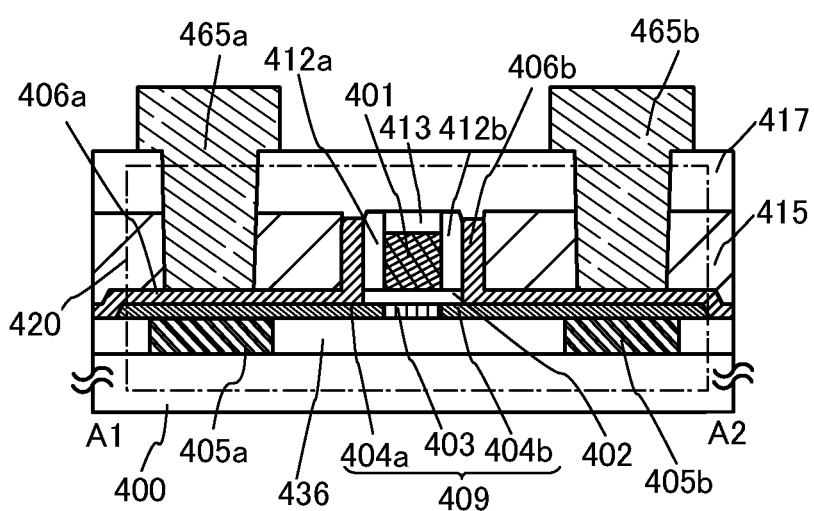

In this embodiment, a basic structure and a basic method for manufacturing a semiconductor device of one embodiment of the present invention are described with reference to drawings. FIGS. 1A and 1B illustrate a semiconductor device of one embodiment of the present invention.

FIG. 1A is a top view of a transistor which is one embodiment of the present invention, and FIG. 1B is a cross-sectional view taken along dashed-dotted line A1-A2 in FIG. 1A.

A semiconductor device including a transistor 420 includes, over a substrate 400, a base insulating layer 436; electrode layers 405a and 405b which are formed in the base insulating layer 436 and top surfaces of which are exposed from the base insulating layer 436; an oxide semiconductor layer 409 including low-resistance regions 404a and 404b which are in contact with the electrode layers 405a and 405b, respectively, and a channel formation region 403 sandwiched by the low-resistance regions 404a and 404b; a gate insulating layer 402 over the oxide semiconductor layer 409; a gate electrode layer 401 over the gate insulating layer 402; sidewall insulating layers 412a and 412b which cover side surfaces of the gate electrode layer 401; an upper insulating layer 413 covering a top surface of the gate electrode layer 401; a source electrode layer 406a and a drain electrode layer 406b which are over the base insulating layer 436 and the oxide semiconductor layer 409 and which are in contact with a side surface of the sidewall insulating layer 412a and a side surface of the sidewall insulating layer 412b; an insulating layer 415 over the source electrode layer 406a and the drain electrode layer 406b; an insulating layer 417 over the insulating layer 415, the source electrode layer 406a, the drain electrode layer 406b, the sidewall insulating layers 412a and 412b, and the upper insulating layer 413; and wiring layers 465a and 465b which are in contact with the source electrode layer 406a and the drain electrode layer 406b, respectively, through openings provided in the insulating layer 415 and the insulating layer 417.

The height of a top surface of the insulating layer 415 is substantially the same as the height of top surfaces of the sidewall insulating layer 412a, the sidewall insulating layer 412b, and the upper insulating layer 413. The heights of top surfaces of the source electrode layer 406a and the drain electrode layer 406b are lower than the heights of top surfaces of the insulating layer 415, the sidewall insulating layer 412a, and the sidewall insulating layer 412b, and are higher than the height of a top surface of the gate electrode layer 401. Note that "a height of a top surface" here means a distance from a top surface of the substrate 400.

The oxide semiconductor layer 409 includes the channel formation region 403 with which the gate electrode layer 401 overlaps, and the low-resistance region 404a and the low-resistance region 404b in each of which resistance is reduced by introduction of an impurity element. The low-resistance regions 404a and 404b are formed in a self-aligned manner by introducing an impurity element into the oxide semiconductor layer 409 using the gate electrode layer 401 as a mask.

Further, the source electrode layer 406a and the drain electrode layer 406b are provided in contact with the sidewall insulating layers 412a and 412b, respectively, and are provided in contact with a top surface of the oxide semiconductor layer 409. Accordingly, the distance (minimum distance) between the gate electrode layer 401 and a region (contact region) in which the oxide semiconductor layer 409 is in contact with the source electrode layer 406a or the drain electrode layer 406b corresponds to a width of the sidewall insulating layer 412a or 412b in the channel length direction, whereby the miniaturization can be achieved and variation in the minimum distance in the manufacturing process can be suppressed.

The low-resistance region 404a and the low-resistance region 404b of the oxide semiconductor layer 409 are in contact with the source electrode layer 406a and the drain electrode layer 406b, respectively, and function as a source region and a drain region of the transistor 420, respectively. The oxide semiconductor layer 409 is in contact with the source electrode layer 406a in the low-resistance region 404a, and is in contact with the drain electrode layer 406b in the low-resistance region 404b. Thus, the contact resistance between the oxide semiconductor layer 409 and each of the source electrode layer 406a and the drain electrode layer 406b is reduced.

The low-resistance regions 404a and 404b are in contact with the electrode layers 405a and 405b, respectively, which are embedded in the base insulating layer 436. The electrode layers 405a and 405b are formed using metal, a conductive metal compound, a semiconductor, or the like. The low-resistance regions 404a and 404b function as a source region and a drain region of the transistor 420. The electrode layers 405a and 405b are provided under the source region and the drain region, so that the source region and the drain region can be thicker, the resistances of the source region and the drain region can be reduced, and the on-state characteristics of the transistor can be improved.

Since the electrode layers 405a and 405b are embedded in the base insulating layer, the coverage with the oxide semiconductor layer 409 provided over the electrode layers 405a and 405b is not affected even when the electrode layers 405a and 405b are formed thick. Thus, the electrode layers 405a and 405b can be thick enough so that the resistances of the source region and the drain region of the transistor 420 are sufficiently reduced. Further, the channel formation region 403 can be formed thin, and only the source region and the drain region can be formed thick because an electrode layer is not provided under the channel formation region 403.

Next, an example of a method for manufacturing the transistor 420 illustrated in FIGS. 1A and 1B is described with reference to FIGS. 2A to 2D, FIGS. 3A to 3D, FIGS. 4A to 4D, and FIGS. 5A and 5B.

First, a conductive film to be the electrode layers 405a and 405b is formed over the substrate 400. A resist mask is formed over the conductive film, and the conductive film is selectively etched to form the electrode layers 405a and 405b. After that, the resist mask is removed.

There is no particular limitation on a substrate that can be used as long as it has heat resistance high enough to withstand heat treatment performed later. For example, a glass substrate of barium borosilicate glass, aluminoborosilicate glass, or the like, a ceramic substrate, a quartz substrate, or a sapphire substrate can be used.

Further, a single crystal semiconductor substrate or a polycrystalline semiconductor substrate which is made of silicon, silicon carbide, or the like, a compound semiconductor substrate made of silicon germanium, or the like, an SOI substrate, any of these substrates over which a semiconductor element is provided, or the like can be used.

A conductive film to be the electrode layers 405a and 405b is formed using a material having heat resistance enough to withstand heat treatment performed later by a CVD method or a sputtering method to have a thickness of greater than or equal to 10 nm and smaller than or equal to 500 nm For example, a metal film containing an element selected from Al, Cr, Cu, Ta, Ti, Mo, and W, or a metal nitride film containing any of the above elements as a component (a titanium nitride film, a molybdenum nitride film, a tungsten nitride film, or a tantalum nitride film) can be used. Further, a stacked-layer structure in which a metal film of Al, Cu, or the like and a metal film of Ti, Mo, W, or the like which has a high melting point are stacked may be employed. Note that the metal film of Ti, Mo, W, or the like which has a high melting point may be provided under and/or over the metal film of Al, Cu, or the like. Further, the conductive film may be formed using an oxide semiconductor material. As the oxide semiconductor, indium oxide ($In_2O_3$), tin oxide ($SnO_2$), zinc oxide (ZnO), indium oxide-tin oxide ($In_2O_3$—$SnO_2$), indium oxide-zinc oxide ($In_2O_3$—ZnO), or any of these metal oxide materials in which silicon oxide is contained can be used.

In the case where the conductive film is formed using an oxide semiconductor, an oxide semiconductor material which is the same as or different from that used for the oxide semiconductor layer 409 may be used. In particular, when the conductive film and the oxide semiconductor layer 409 are formed using the same oxide semiconductor material, the contact resistance between the oxide semiconductor layer 409 and each of the electrode layers 405a and 405b can be further reduced, and thus, a transistor with favorable electrical characteristics can be manufactured. For example, when an In—Ga—Zn based oxide (also referred to as IGZO) is used as the oxide semiconductor material, the IGZO is preferably also used for the electrode layers 405a and 405b.

In this embodiment, a 30-nm-thick IGZO film with an atomic ratio of In to Ga and Zn of 1:1:1 is formed by a sputtering method as the conductive film, and then etched using a resist mask to form the electrode layers 405a and 405b.

Figure 2A:
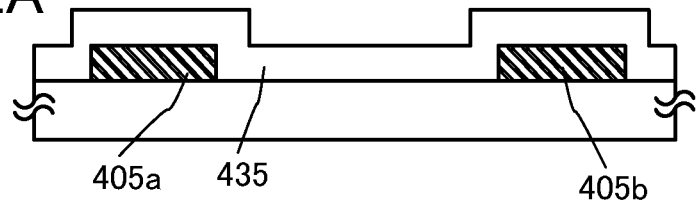
FIGS. 2A to 2D illustrate a method for manufacturing a semiconductor device of one embodiment of the present invention.

Next, a base insulating film 435 is formed to cover the substrate 400 and the electrode layers 405a and 405b (see FIG. 2A). The base insulating film 435 can be formed by a sputtering method, an MBE method, a CVD method, a pulsed laser deposition method, an ALD method, or the like as appropriate. When the base insulating film 435 is formed by a sputtering method, an impurity element such as hydrogen can be reduced.

As the base insulating film 435, an oxide insulating layer formed using silicon oxide, gallium oxide, aluminum oxide, silicon oxynitride, silicon nitride oxide, hafnium oxide, tantalum oxide, or the like is preferably used. Further, the base insulating film 435 can be formed with a single-layer structure or a stacked-layer structure including two or more layers with the use of these compounds. In the case of a stacked-layer structure, for example, it is possible to use a silicon oxide film formed by a CVD method as a base insulating layer which is in contact with a substrate and a silicon oxide film formed by a sputtering method as a base insulating layer which is in contact with the oxide semiconductor layer 409. An oxide insulating layer in which the concentration of hydrogen is reduced is used as the insulating layer which is in contact with the oxide semiconductor layer, whereby diffusion of hydrogen in the oxide semiconductor layer 409 is prevented, and in addition, oxygen is supplied from the oxide insulating layer, which is to be the base insulating layer 436, to oxygen defects in the oxide semiconductor layer 409. Thus, the transistor 420 having favorable electrical characteristics can be provided.

Here, silicon oxynitride means the one that contains more oxygen than nitrogen and for example, silicon oxynitride includes oxygen, nitrogen, and silicon at concentrations ranging from greater than or equal to 50 atomic % and less than or equal to 70 atomic %, greater than or equal to 0.5 atomic % and less than or equal to 15 atomic %, and greater than or equal to 25 atomic % and less than or equal to 35 atomic %, respectively. Note that rates of oxygen, nitrogen, and silicon fall within the aforementioned ranges in the cases where measurement is performed using Rutherford backscattering spectrometry (RBS) or hydrogen forward scattering (HFS). In addition, the total of the percentages of the constituent elements does not exceed 100 atomic %.

Because the base insulating film 435 is to be in contact with the oxide semiconductor layer 409, the base insulating film 435 preferably contains oxygen which exceeds at least the stoichiometric composition in the layer (the bulk). For example, in the case where a silicon oxide layer is used as the base insulating film 435, the composition formula is $SiO_{2+\alpha}$ ($\alpha>0$).

The electrode layers 405a and 405b may be subjected to nitrogen plasma treatment before the base insulating film 435 is formed. By performing nitrogen plasma treatment, the contact resistance between the oxide semiconductor layer 409 to be formed later and each of the electrode layers 405a and 405b can be further reduced.

Figure 2B:
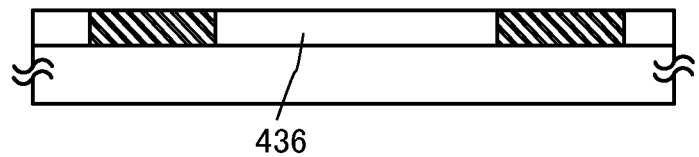

Next, polishing treatment (e.g., chemical mechanical polishing (CMP)) or etching treatment are performed on the base insulating film 435, whereby top surfaces of the electrode layers 405a and 405b are exposed from the base insulating film 435, and the base insulating layer 436 a top surface of which has the same height as top surfaces of the electrode layer 405a and the electrode layer 405b is formed (see FIG. 2B). As the polishing treatment or etching treatment may be performed plural times and/or in combination. When the polishing treatment and etching treatment are performed in combination, there is no particular limitation on the order of the steps. The surface of the base insulating layer 436 is preferably formed as flat as possible in order to improve the crystallinity of the oxide semiconductor layer to be provided over the base insulating layer 436.

A method in which the base insulating layer 436 is formed after the electrode layers 405a and 405b are formed is described in this embodiment; however, a method for forming the electrode layers 405a and 405b and the base insulating layer 436 is not limited thereto. For example, the electrode layers 405a and 405b may be formed as follows: the base insulating layer 436 is provided over the substrate 400, openings are formed in the base insulating layer 436 by an etching step or the like, and the openings are filled with a conductive material.

Since, in this embodiment, the electrode layers 405a and 405b are embedded in the base insulating layer 436, the coverage with the oxide semiconductor layer to be provided later is not affected even when the electrode layers 405a and 405b are formed thick. Thus, the electrode layers 405a and 405b can be thick enough so that the resistances of the source region and the drain region are sufficiently reduced. For example, the electrode layers 405a and 405b are preferably thicker than the source electrode layer 406a, the drain electrode layer 406b, or the oxide semiconductor layer 409 which are to be formed later.

Next, an oxide semiconductor film is formed over the base insulating layer 436 and the electrode layers 405a and 405b. The oxide semiconductor film can be formed by a sputtering method, an evaporation method, a pulsed laser deposition (PLD) method, an ALD method, an MBE method, or the like.

A resist mask is formed over the oxide semiconductor film, and the oxide semiconductor film is etched to have an island shape. After that, the resist mask is removed, and the oxide semiconductor layer 409 is formed. The oxide semiconductor layer 409 may cover the electrode layers 405a and 405b completely. Alternatively, the following structure may be used: end portions of the oxide semiconductor layer 409 overlap with the electrode layers 405a and 405b, and part of the top surfaces of the electrode layers 405a and 405b is exposed.

Figure 5A:
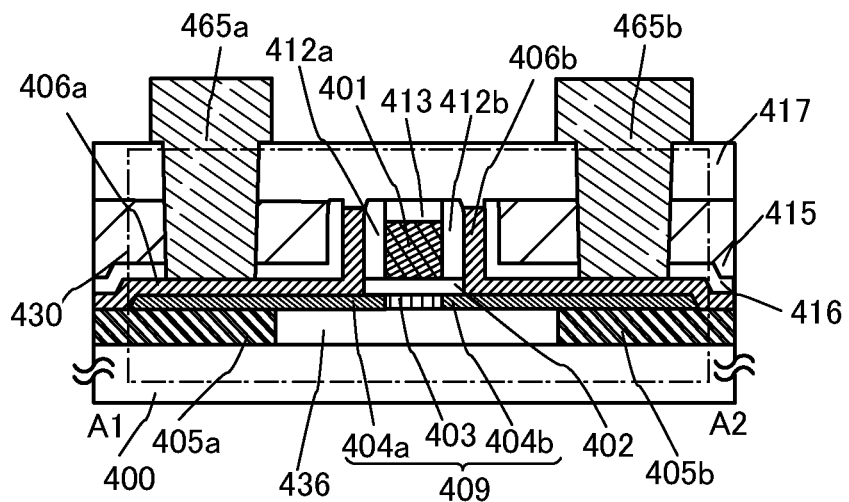
FIGS. 5A and 5B are cross-sectional views each illustrating a semiconductor device of one embodiment of the present invention.

In the case where part of the top surfaces of the electrode layers 405a and 405b is exposed, the electrode layers 405a and 405b may be in contact with the source electrode layer 406a and the drain electrode layer 406b, respectively, which are to be formed later. For example, FIG. 5A illustrates a structure in which the electrode layers 405a and 405b are in contact with the source electrode layer 406a and the drain electrode layer 406b, respectively.

An oxide semiconductor to be used for the oxide semiconductor layer 409 preferably contains at least indium (In) or zinc (Zn). In particular, In and Zn are preferably contained. As a stabilizer for reducing variation in electrical characteristics of the transistor including the oxide semiconductor, gallium (Ga) is preferably additionally contained. In addition, the oxide semiconductor preferably contains tin (Sn), hafnium (Hf), or aluminum (Al) as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), or zirconium (Zr) may be contained.

As the oxide semiconductor, for example, any of the following can be used: a single-component metal oxide such as indium oxide, tin oxide, or zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide, an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn-based oxide" means an oxide containing In, Ga, and Zn as its main component and there is no particular limitation on the ratio of In:Ga:Zn. The In—Ga—Z-based oxide may contain another metal element in addition to In, Ga, and Zn.

Alternatively, a material represented by a chemical formula, $InMO_3(ZnO)_m$ (m>0, m is not an integer) may be used as an oxide semiconductor. Note that M represents one or more metal elements selected from Ga, Fe, Mn, and Co. Alternatively, as the oxide semiconductor, a material expressed by a chemical formula, $In_2SnO_5(ZnO)_n$ (n>0, n is an integer) may be used.

For example, an In—Ga—Zn-based oxide with an atomic ratio of In to Ga and Zn of 1:1:1 (=1/3:1/3:1/3) or 2:2:1 (=2/5:2/5:1/5), or an oxide with an atomic ratio close to the above atomic ratios can be used. Alternatively, an In—Sn—Zn-based oxide with an atomic ratio of In to Sn and Zn of 1:1:1 (=1/3:1/3:1/3), 2:1:3 (=1/3:1/6:1/2), or 2:1:5 (=1/4:1/8:5/8), or an oxide with an atomic ratio close to the above atomic ratios may be used.

For example, in the case where the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1), a, b, and c satisfy the following relation: $(a-A)^2+(b-B)^2+(c-C)^2 \le r^2$, and r may be 0.05, for example. The same applies to other oxides.

However, without limitation to the materials given above, a material with an appropriate composition may be used depending on needed electrical characteristics (e.g., mobility, threshold voltage, and variation). In order to obtain the needed electrical characteristics, it is preferable that the carrier concentration, the impurity element concentration, the defect density, the atomic ratio between a metal element and oxygen, the interatomic distance, the density, and the like be set to appropriate values.

For example, high mobility can be obtained relatively easily in the case of using an In—Sn—Zn-based oxide. However, the mobility can be increased by reducing the defect density in the bulk also in the case of using the In—Ga—Zn-based oxide.

Note that the oxide semiconductor film may have an amorphous structure or a crystalline structure. As a preferable embodiment of the oxide semiconductor film, a c-axis aligned crystalline oxide semiconductor (CAAC-OS) film can be given. The CAAC-OS film is not completely single crystal nor completely amorphous. The CAAC-OS film is an oxide semiconductor film with a crystal-amorphous mixed phase structure where crystal parts and amorphous parts are included in an amorphous phase. Note that in most cases, the crystal part fits inside a cube whose one side is less than 100 nm. Note that from an observation image obtained with a transmission electron microscope (TEM), a boundary between an amorphous part and a crystal part in the CAAC-OS film is not always clear. Further, with the TEM, a grain boundary in the CAAC-OS film is not found. Thus, in the CAAC-OS film, a reduction in mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°. Note that part of oxygen included in the oxide semiconductor film may be substituted with nitrogen.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electrical characteristics of the transistor due to irradiation with visible light or ultraviolet light is small. Thus, the transistor has high reliability.

Further, when the oxide semiconductor layer 409 is formed to have a stacked structure, the first oxide semiconductor film, the second oxide semiconductor film, and the third oxide semiconductor film may be formed using oxide semiconductor films having different crystallinity. That is, the oxide semiconductor layer 409 may be formed by combining a single crystal oxide semiconductor film, a polycrystalline oxide semiconductor film, an amorphous oxide semiconductor film, and a CAAC-OS film as appropriate. When an amorphous oxide semiconductor film is applied to any of the first oxide semiconductor film, the second oxide semiconductor film, and the third oxide semiconductor film, internal stress or external stress of the oxide semiconductor film is relieved, variation in characteristics of a transistor is reduced, and reliability of the transistor can be further improved.

Note that part of oxygen included in the oxide semiconductor film may be substituted with nitrogen.

Note that for example, in the case where the oxide semiconductor layer is formed using an In—Zn-based metal oxide, a target has a composition where In/Zn is 1 to 100, preferably 1 to 20, more preferably 1 to 10 in an atomic ratio. The atomic ratio of Zn is in the preferred range, whereby the mobility can be improved. Here, when the atomic ratio of the metal oxide is In:Zn:O=X:Y:Z, it is preferable to satisfy the relation of $Z>1.5X+Y$ so that excess oxygen is contained.

In the case of forming the oxide semiconductor layer using an In—Ga—Zn-based oxide by a sputtering method, it is preferable to use an In—Ga—Zn—O target having an atomic ratio of In to Ga and Zn of 1:1:1, 4:2:3, 3:1:2, 1:1:2, 2:1:3, or 3:1:4. When the oxide semiconductor film is formed using an In—Ga—Zn—O target having the above atomic ratio, a polycrystal semiconductor film or a CAAC-OS film is easily formed.

In the case of forming the oxide semiconductor layer using an In—Sn—Zn-based oxide by a sputtering method, it is preferable to use an In—Sn—Zn—O target having an atomic ratio of In to Sn and Zn of 1:1:1, 2:1:3, 1:2:2, or 20:45:35. When the oxide semiconductor layer is formed using an In—Sn—Zn—O target having the above atomic ratio, a polycrystal semiconductor film or a CAAC-OS film is easily formed.

The relative density of the target is greater than or equal to 90% and less than or equal to 100%, preferably greater than or equal to 95% and less than or equal to 99.9%. With the target having a high filling factor, a dense oxide semiconductor layer can be formed.

Note that the energy gap of a metal oxide which can be applied to the oxide semiconductor layer is preferably greater than or equal to 2 eV, more preferably greater than or equal to 2.5 eV, still more preferably greater than or equal to 3 eV. In this manner, the off-state current of a transistor can be reduced by using a metal oxide having a wide band gap.

Note that the concentrations of an alkali metal and an alkaline earth metal in the oxide semiconductor layer are preferably low, and these concentrations are preferably lower than or equal to $1\times10^{18}$ atoms/cm$^3$, more preferably lower than or equal to $2\times10^{16}$ atoms/cm$^3$. When an alkali metal and an alkaline earth metal are bonded to an oxide semiconductor, carriers are generated in some cases, which causes an increase in the off-state current of the transistor.

Further, the oxide semiconductor film may have a structure in which a plurality of oxide semiconductor films is stacked. For example, the oxide semiconductor layer may have a stacked-layer structure of a first oxide semiconductor film and a second oxide semiconductor film which are formed using metal oxides with different compositions. For example, the first oxide semiconductor film may be formed using any of two-component metal oxide, a three-component metal oxide, and a four-component metal oxide, and the second oxide semiconductor film may be formed using any of these which is different from the oxide for the first oxide semiconductor film.

Further, the constituent elements of the first oxide semiconductor film and the second oxide semiconductor film are made to be the same and the composition of the constituent elements of the first oxide semiconductor film and the second oxide semiconductor film may be made to be different. For example, the first oxide semiconductor film may have an atomic ratio of In to Ga and Zn of 1:1:1 or an atomic ratio in the neighborhood of the atomic ratio and the second oxide semiconductor film may have an atomic ratio of In to Ga and Zn of 3:1:2 or an atomic ratio in the neighborhood of the atomic ratio. Alternatively, the first oxide semiconductor film may each have an atomic ratio of In to Ga and Zn of 1:3:2 or an atomic ratio in the neighborhood of the atomic ratio, and the second oxide semiconductor film may have an atomic ratio of In to Ga and Zn of 2:1:3 or an atomic ratio in the neighborhood of the atomic ratio.

At this time, one of the first oxide semiconductor film and the second oxide semiconductor film which is closer to the gate electrode layer 401 to be formed later (on a channel side) preferably contains In and Ga at a proportion of In>Ga. The other which is farther from the gate electrode layer 401 (on a back channel side) preferably contains In and Ga at a proportion of In≤Ga.

Further, the constituent elements of the first oxide semiconductor film, the second oxide semiconductor film, and the third oxide semiconductor film are made to be the same, and the composition of the constituent elements of the first oxide semiconductor film, the second oxide semiconductor film, and the third oxide semiconductor film may be made to be different. For example, the first oxide semiconductor film may have an atomic ratio of In to Ga and Zn of 1:3:2, the second oxide semiconductor film may have an atomic ratio of In to Ga and Zn of 3:1:2, and the third oxide semiconductor film may have an atomic ratio of In to Ga and Zn of 1:1:1.

An oxide semiconductor film which contains less In than Ga and Zn at atomic ratio, typically, the first oxide semiconductor film having an atomic ratio of In to Ga and Zn of 1:3:2, has a higher insulating property than an oxide semiconductor film which contains more In than Ga and Zn at atomic ratio, typically, the second oxide semiconductor film, and an oxide semiconductor film which contains Ga, Zn, and In at the same atomic ratio, typically, the third oxide semiconductor film. Further, when the first oxide semiconductor film having an atomic ratio of In to Ga and Zn of 1:3:2 has an amorphous structure, the insulating property is further improved.

Since the constituent elements of the first oxide semiconductor film, the second oxide semiconductor film, and the third oxide semiconductor film are the same, the first oxide semiconductor film has fewer trap levels at the interface with the second oxide semiconductor film. Accordingly, when an oxide semiconductor film has the above structure, changes over time or variation in threshold voltage of a transistor due to a BT stress test under light can be reduced.

In an oxide semiconductor, the s orbital of heavy metal mainly contributes to carrier transfer, and when the In content in the oxide semiconductor is increased, overlap of the s orbital is likely to be increased. Therefore, an oxide having a composition of In>Ga has higher mobility than an oxide having a composition of In≤Ga. Further, in Ga, the formation energy of oxygen defects is larger and thus oxygen defects is less likely to occur, than in In; therefore, the oxide having a composition of In≤Ga has more stable characteristics than the oxide having a composition of In>Ga.

An oxide semiconductor containing In and Ga at a proportion of In>Ga is used on a channel side, and an oxide semiconductor containing In and Ga at a proportion of In≤Ga is used on a back channel side; so that field-effect mobility and reliability of a transistor can be further improved.

The oxide semiconductor layer 409 has a thickness greater than or equal to 1 nm and less than or equal to 100 nm, preferably greater than or equal to 1 nm and less than or equal to 20 nm. In the transistor 420, the oxide semiconductor layer 409 is in contact with the wiring layer 465*a* in a region where the oxide semiconductor layer 409 overlaps with the electrode layer 405*a*, and is in contact with the wiring layer 465*b* in a region where the oxide semiconductor layer 409 overlaps with the electrode layer 405*b*. Therefore, even when the thickness of the oxide semiconductor layer is reduced by miniaturization of the transistor, electrical connection between the oxide semiconductor layer 409 and each of the wiring layers 465*a* and 465*b* can be ensured by the electrode layers 405*a* and 405*b* which are provided to overlap with the oxide semiconductor layer 409.

The oxide semiconductor layer 409 is formed in an oxygen gas atmosphere preferably by a sputtering method. The substrate heating temperature is set to higher than or equal to 100° C. and lower than or equal to 600° C., preferably higher than or equal to 150° C. and lower than or equal to 550° C., further preferably higher than or equal to 200° C. and lower than or equal to 500° C. The impurity element concentration in the obtained oxide semiconductor layer 409 is decreased with an increase in the substrate heating temperature in film formation. Further, the atomic arrangement in the oxide semiconductor layer 409 is ordered and the density thereof is increased, so that a polycrystalline oxide semiconductor film or a CAAC-OS film is likely to be formed.

When a CAAC-OS film is formed, for example, the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby the CAAC-OS film can be formed.

For the formation of the CAAC-OS film, the following conditions are preferably used.

By reducing the amount of impurities entering the CAAC-OS film during formation, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during formation, migration of a sputtered particle is likely to occur after the sputtered particle reaches a substrate surface. Specifically, the substrate heating temperature during formation is higher than or equal to 100° C. and lower than or equal to 740° C., preferably higher than or equal to 200° C. and lower than or equal to 500° C. By increasing the substrate heating temperature during formation, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the formation. The proportion of oxygen in the deposition gas is higher than or equal to 30 vol %, preferably 100 vol %.

As an example of the sputtering target, an In—Ga—Zn-based oxide target is described below.

The In—Ga—Zn-based oxide target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y and Z are given positive numbers. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

Furthermore, when an oxygen gas atmosphere is employed for the formation, an unnecessary atom such as a rare gas atom is not contained in the oxide semiconductor layer 409, so that a polycrystalline oxide semiconductor film or a CAAC-OS film is easily formed. Note that a mixed gas atmosphere including an oxygen gas and a rare gas may be used. In that case, the percentage of an oxygen gas is higher than or equal to 30 vol. %, preferably higher than or equal to 50 vol. %, more preferably higher than or equal to 80 vol. %. It is preferable that argon and oxygen used for formation of the oxide semiconductor film do not contain water, hydrogen, and the like. For example, it is preferable that argon have a purity of 9N, a dew point of −121° C., a water content of 0.1 ppb, and a hydrogen content of 0.5 ppb and oxygen have a purity of 8N, a dew point of −112° C., a water content of 1 ppb, and a hydrogen content of 1 ppb.

In this embodiment, a 10-nm-thick IGZO film having an atomic ratio of In to Ga and Zn of 3:1:2 is formed by a sputtering method under an atmosphere of argon and oxygen at a flow ratio of 2:1, respectively.

In an oxide semiconductor in an amorphous state, a flat surface can be obtained with relative ease, so that interface scattering of a carrier (electron) of a transistor including the oxide semiconductor in an amorphous state in operation can be suppressed, and relatively high mobility can be obtained with relative ease.

In an oxide semiconductor having crystallinity, defects in the bulk can be further reduced and when a surface flatness is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, more preferably less than or equal to 0.1 nm.

Note that Ra is obtained by expanding, into three dimensions, arithmetic mean surface roughness that is defined by JIS B 0601:2001 (ISO4287:1997) so as to be able to apply it to a curved surface. Ra can be expressed as an "average value of the absolute values of deviations from a reference surface to a designated surface" and is defined by the following formula.

$$Ra = \frac{1}{S_0} \int_{y_1}^{y_2} \int_{x_1}^{x_2} |f(x, y) - Z_0| \, dx \, dy \quad \text{[FORMULA 1]}$$

Here, the specific surface is a surface which is a target of roughness measurement, and is a quadrilateral region which is specified by four points represented by the coordinates ($x_1$, $y_1$, $f(x_1, y_1)$), ($x_1$, $y_2$, $f(x_1, y_2)$), ($x_2$, $y_1$, $f(x_2, y_1)$), and ($x_2$, $y_2$, $f(x_2, y_2)$). Moreover, $S_0$ represents the area of a rectangle which is obtained by projecting the specific surface on the xy plane, and $Z_0$ represents the height of the reference surface (the average height of the specific surface). Ra can be measured using an atomic force microscope (AFM).

In addition, the reference surface is a surface parallel to an X-Y plane at the average height of the specific surface. In short, when the average value of the height of the specific surface is denoted by $Z_0$, the height of the reference surface is also denoted by $Z_0$.

In order to make the average surface roughness of the base insulating layer in a region of the oxide semiconductor layer in which a channel is formed less than or equal to 0.3 nm, planarization treatment may be performed. The planarization treatment may be performed before the oxide semiconductor film is formed.

For example, dry etching or the like may be performed as the planarization treatment. As the etching gas, a chlorine-based gas such as a chlorine gas, a boron chloride gas, a silicon chloride gas, or a carbon tetrachloride gas, a fluorine-based gas such as a carbon tetrafluoride gas, a sulfur fluoride gas, or a nitrogen fluoride gas, or the like may be used.

Further, it is preferable that hydrogen contained in the oxide semiconductor layer be as little as possible. Note that the hydrogen may be contained in the oxide semiconductor layer in the form of a hydrogen molecule, water, a hydroxyl group, or hydride in some cases, in addition to a hydrogen atom. Thus, the oxide semiconductor layer is preferably subjected to heat treatment for removing excess hydrogen (including water and a hydroxyl group) in the oxide semiconductor layer (dehydration or dehydrogenation). The temperature of the heat treatment is higher than or equal to 300° C. and lower than or equal to 700° C., or lower than the strain point of a substrate. The heat treatment can be performed under reduced pressure, a nitrogen atmosphere, or the like. Note that the heat treatment may be performed before the formed oxide semiconductor film is processed into an island-like shape or after the oxide semiconductor film is processed into an island-like shape. Further, the heat treatment for the dehydration or dehydrogenation may be performed plural times, and may double as another heat treatment.

The heat treatment is preferably performed in such a manner that after heat treatment is performed in a reduced-pressure atmosphere or an inert atmosphere, the atmosphere is switched to an oxidation atmosphere with the temperature maintained and heat treatment is further performed. When the heat treatment is performed in a reduced-pressure atmosphere or an inert atmosphere, the concentration of an impurity (e.g., hydrogen) in the oxide semiconductor layer can be reduced; however, oxygen vacancies might be caused at the same time. By the heat treatment in the oxidation atmosphere, the caused oxygen vacancies can be reduced.

By performing heat treatment on the oxide semiconductor layer, the concentration of an impurity element (e.g., hydrogen) in the layer can be significantly reduced. As a result, the field-effect mobility of the transistor can be increased to close to the ideal field-effect mobility.

Note that it is preferable that oxygen be contained in the oxide semiconductor layer 409 in excess of the amount in the stoichiometric composition. When excess oxygen is contained, generation of carriers due to oxygen defects in the formed oxide semiconductor layer 409 can be prevented. In order for the oxide semiconductor layer 409 to contain excess oxygen, film formation may be performed under conditions such that a large amount of oxygen is contained at the time of the film formation. Alternatively, oxygen (including at least one of an oxygen radical, an oxygen atom, and an oxygen ion) may be introduced after formation of the oxide semiconductor film so that oxygen is contained in excess of the amount in the film. As the method for introduction of oxygen, an ion implantation method, an ion doping method, a plasma immersion ion implantation method, plasma treatment, or the like can be used.

Note that in the case where the oxide insulating layer is used as the base insulating layer, when heat treatment is performed while the oxide semiconductor layer is provided over the oxide insulating layer, oxygen can be supplied to the oxide semiconductor layer, the oxygen defects in the oxide semiconductor layer can be reduced, and electrical characteristics can be improved. The oxide semiconductor layer and the oxide insulating layer may be subjected to a heating step in a state where the oxide semiconductor layer and the oxide insulating layer are at least partly in contact with each other so that oxygen is supplied to the oxide semiconductor layer. Note that the heat treatment may be performed before the oxide semiconductor film is processed into an island-like shape or after the oxide semiconductor film is processed into an island-like shape. It is preferable to perform the heat treatment before the oxide semiconductor film is processed into an island-like shape, because the amount of oxygen released from the base insulating layer to the outside is small and thus the larger amount of oxygen can be supplied to the oxide semiconductor layer.

Figure 2C:
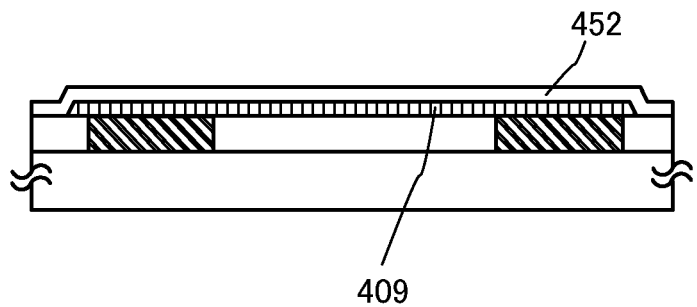

Subsequently, a gate insulating film 452 is formed over the oxide semiconductor layer 409 (see FIG. 2C).

When the gate insulating film 452 is formed using a high-k material such as hafnium oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)), or lanthanum oxide, gate leakage current can be reduced. Further, the gate insulating film 452 may have either a single-layer structure or a stacked-layer structure.

The gate insulating film 452 has a thickness greater than or equal to 1 nm and less than or equal to 20 nm and can be formed by a sputtering method, an MBE method, a CVD method, a PLD method, an ALD method, or the like as appropriate. The gate insulating film 452 may also be formed with a sputtering apparatus which performs film formation in the state where surfaces of a plurality of substrates are substantially perpendicular to a surface of a sputtering target.

In this embodiment, a 20-nm-thick silicon oxynitride film is formed by a CVD method.

Like the base insulating layer 436, the gate insulating film 452 is in contact with the oxide semiconductor layer. Thus, a large amount of oxygen, which exceeds at least the stoichiometric composition, is preferably contained in the layer (the bulk).

A planarization treatment may be performed on the top surface of the oxide semiconductor layer 409 in order to improve coverage with the gate insulating film 452. The surface of the oxide semiconductor layer 409 preferably has favorable planarity particularly when an insulating layer having a small thickness is used as the gate insulating film 452.

Figure 2D:
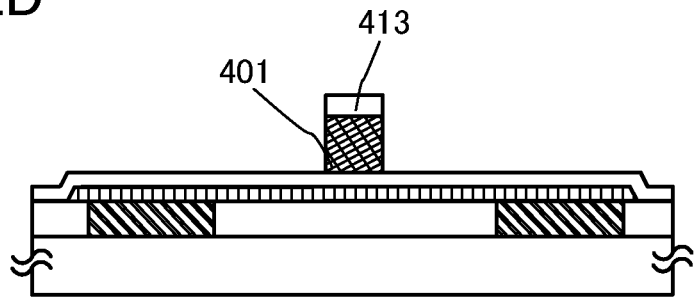

Next, a conductive film and an insulating film are stacked over the gate insulating film 452 and the oxide semiconductor layer 409, and the conductive film and the insulating film are etched, so that the gate electrode layer 401 and the upper insulating layer 413 are formed in a region which overlaps with a region which is sandwiched between the electrode layers 405a and 405b (see FIG. 2D).

The gate electrode layer 401 can be formed using a metal material such as molybdenum, titanium, tantalum, tungsten, aluminum, copper, chromium, neodymium, or scandium or an alloy material which contains any of these materials as its main component. A semiconductor film which is doped with an impurity element such as phosphorus and is typified by a polycrystalline silicon film, or a silicide film of nickel silicide or the like can also be used as the gate electrode layer 401. Further, the gate electrode layer 401 can also be formed using a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible that the gate electrode layer 401 has a stacked structure of the above conductive material and the above metal material.

As one layer of the gate electrode layer 401 which is in contact with the gate insulating film 452, a metal oxide film containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. These films each have a work function higher than or equal to 5 eV, preferably higher than or equal to 5.5 eV; thus, when these are used as a gate electrode, the threshold voltage of the electrical characteristics of the transistor can be positive.

In this embodiment, a 100-nm-thick tungsten film is formed by a sputtering method.

For the upper insulating layer 413, typically, an inorganic insulating material such as silicon oxide, silicon oxynitride, aluminum oxide, aluminum oxynitride, silicon nitride, aluminum nitride, silicon nitride oxide, or aluminum nitride oxide can be used. The upper insulating layer 413 can be formed by a CVD method, a sputtering method, or the like.

In this embodiment, a 200-nm-thick silicon oxynitride film is formed by a CVD method as the upper insulating layer 413. After that, the upper insulating layer 413 and the gate electrode layer 401 are processed into an island shape by a dry etching method. At this time, the gate insulating layer 402 may also be etched.

Figure 3A:
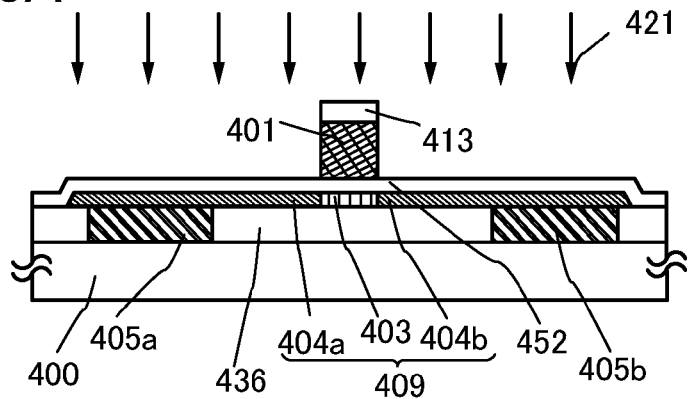
FIGS. 3A to 3D illustrate a method for manufacturing a semiconductor device of one embodiment of the present invention.
Figure 3B:
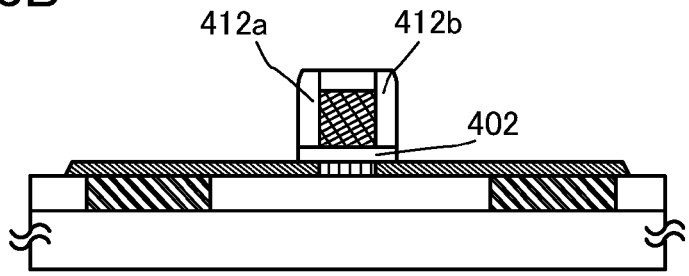
Figure 3C:
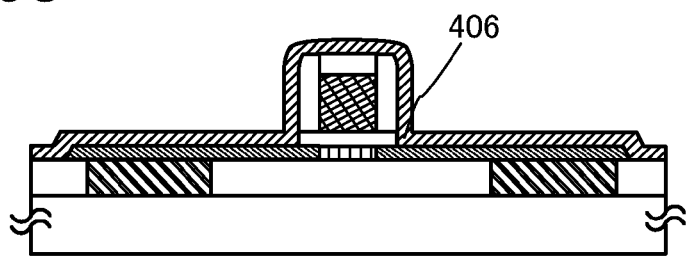

Next, an impurity element 421 is introduced into the oxide semiconductor layer 409 using the gate electrode layer 401 and the upper insulating layer 413 as masks, so that the low-resistance regions 404a and 404b are formed in a self-aligned manner in a region of the oxide semiconductor layer 409 which does not overlap with the gate electrode layer 401 (see FIG. 3A). Note that a region of the oxide semiconductor layer 409 to which the impurity element 421 is not introduced serves as the channel formation region 403.

Consequently, in the oxide semiconductor layer 409, the channel formation region 403 with which the gate electrode layer 401 overlaps is formed, and the low-resistance region 404a and the low-resistance region 404b each having resistance lower than that of the channel formation region 403 are formed with the channel formation region 403 interposed therebetween. As the method for adding the impurity element 421, an ion implantation method, an ion doping method, a plasma immersion ion implantation method, or the like can be used.

Phosphorus, boron, nitrogen, arsenic, argon, aluminum, a molecular ion containing any of the above element, or the like can be used as the impurity element to be introduced. The dosage of such an element is preferably $1 \times 10^{13}$ ions/cm$^2$ to $5 \times 10^{16}$ ions/cm$^2$. When phosphorus is introduced as the impurity element, the acceleration voltage is preferably 0.5 kV to 80 kV.

In this embodiment, phosphorus is introduced as the impurity element.

Note that the treatment for introducing the impurity element into the oxide semiconductor layer 409 may be performed plural times. In the case where the treatment for introducing the impurity element into the oxide semiconductor layer 409 is performed plural times, the kind of impurity element may be the same in the plural treatments or different in every treatment.

When the oxide semiconductor layer 409 includes the low-resistance regions 404a and 404b which have resistance reduced by introduction of an impurity element, the resistance between the oxide semiconductor layer 409 and each of the source electrode layer 406a and the drain electrode layer 406b is reduced. Accordingly, an electric field near the source electrode layer 406a and the drain electrode layer 406b is relaxed, and the transistor 420 can be a semiconductor device with good electrical characteristics, which has high on-state characteristics and which is capable of high-speed operation and high-speed response.

Note that due to the introduction of an impurity element, a crystal structure of the oxide semiconductor layer is changed in some cases. In the semiconductor device in this embodiment, an oxide semiconductor layer which includes regions differing in crystallinity may be used. For example, the channel formation region 403 may have crystallinity higher than that of the low-resistance region 404a and the low-resistance region 404b. Specifically, the oxide semiconductor of the channel formation region 403 can be formed using the CAAC-OS film, while a region of the low-resistance region 404a which is in contact with the electrode layer 405a and a region of the low-resistance region 404b which is in contact with the electrode layer 405b can be amorphous films.

Further, in the case where the electrode layers 405a and 405b are formed using an oxide semiconductor material, an impurity element can be introduced into the electrode layers 405a and 405b at the time of introducing the impurity element into the oxide semiconductor layer 409, so that the electrode layers 405a and 405b can also be reduced in resistance. The electrode layer 405a and the electrode layer 405b are in contact with the oxide semiconductor layer 409 in a region whose resistance is reduced. Thus, a semiconductor device can have low contact resistance and excellent on-state characteristics.

Next, an insulating film is formed over the gate electrode layer 401 and the upper insulating layer 413, and the insulating film is etched, so that the sidewall insulating layers 412a and 412b are formed. Further, the gate insulating film 452 is etched using the gate electrode layer 401 and the sidewall insulating layers 412a and 412b as masks, so that the gate insulating layer 402 is formed (see FIG. 3B).

The sidewall insulating layers 412a and 412b can be formed using a material and a method similar to those of the upper insulating layer 413. In this embodiment, a 70-nm-thick silicon oxynitride film is formed by a CVD method.

Next, a conductive film for forming a source electrode layer and a drain electrode layer (including a wiring or the like formed of the same layer as the source electrode layer and the drain electrode layer) is formed over the oxide semiconductor layer 409, the gate insulating layer 402, the gate electrode layer 401, the sidewall insulating layers 412a and 412b, and the upper insulating layer 413.

The conductive film can be formed using a material and a method similar to those of the gate electrode layer 401. In this embodiment, a 30-nm-thick tungsten film is formed by a sputtering method.

A resist mask is formed over the conductive film by a photolithography process, and is selectively etched, so that an island-shaped conductive film 406 is formed. Then, the resist mask is removed (see FIG. 3C). Note that in this etching step, a region of the conductive film 406 which overlaps with the gate electrode layer 401 is not removed.

Figure 3D:
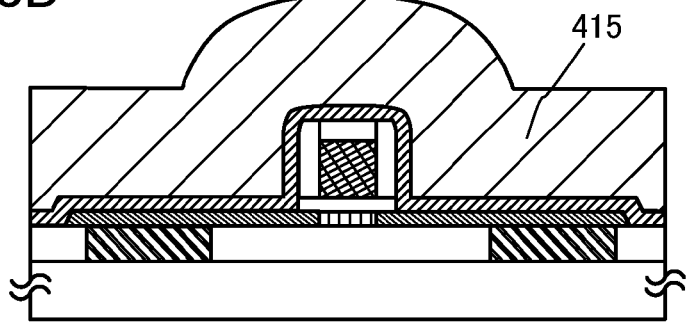

The insulating layer 415 is formed over the island-shaped conductive film 406 (see FIG. 3D).

The insulating layer 415 can be formed using a material and a method similar to those of the upper insulating layer 413. The insulating layer 415 is formed to have a thickness which is large enough to planarize unevenness caused by the transistor 420. In this embodiment, a 500-nm-thick silicon oxynitride film is formed by a CVD method.

Further the insulating layer 415 may be a single layer or a stacked layer of different insulating layers. When the insulating layer 415 has a stacked-layer structure, a structure in which the insulating layer 415 and an insulating layer 416 are provided over the source electrode layer 406a and the drain electrode layer 406b can be employed as in a transistor 430 illustrated in FIG. 5A. For example, the insulating layer 416 can be an aluminum oxide layer, and the insulating layer 415 can be a silicon oxide layer.

Next, chemical mechanical polishing treatment is performed on the insulating layer 415 and the conductive film 406. Part of the insulating layer 415 and part of the conductive film 406 are removed so that the upper insulating layer 413 is exposed (see FIG. 4A).

By the polishing treatment, the conductive film 406 which overlaps with the gate electrode layer 401 is removed; thus, the conductive film 406 becomes the source electrode layer 406a and the drain electrode layer 406b.

The source electrode layer 406a and the drain electrode layer 406b are provided in contact with the top surface of the oxide semiconductor layer 409, and are in contact with the sidewall insulating layers 412a and 412b, respectively. Accordingly, the distance (minimum distance) between the gate electrode layer 401 and the region (contact region) in which the oxide semiconductor layer 409 is in contact with the source electrode layer 406a or the drain electrode layer 406b corresponds to a width of the sidewall insulating layer 412a or 412b in the channel length direction, whereby the further miniaturization can be achieved and variation in the minimum distance in the manufacturing process can be suppressed.

A chemical mechanical polishing method is used for removing the insulating layer 415 and the conductive film 406 in this embodiment; however, another cutting (grinding or polishing) method may be used. Further, in addition to the cutting (grinding or polishing) method such as a chemical mechanical polishing method, an etching (dry etching or wet etching) method, plasma treatment, or the like may be employed in combination for the step of removing the conductive film 406 which overlaps the gate electrode layer 401. For example, after the removing step by a chemical mechanical polishing method, a dry etching method or plasma treatment may be performed in order to improve the planarity of the processed surface. When the cutting (grinding or polishing) method is employed in combination with an etching method, plasma treatment, or the like, the order of steps is not particularly limited and may be set as appropriate depending on the materials, the film thicknesses, and the surface roughness of the insulating layer 415 and the conductive film 406.

Note that in this embodiment, the source electrode layer 406a and the drain electrode layer 406b are provided in contact with side surfaces of the sidewall insulating layers 412a and 412b provided on side surfaces of the gate electrode layer 401, and the source electrode layer 406a and the drain electrode layer 406b each of which has an upper end portion positioned a little lower than those of the sidewall insulating layers 412a and 412b cover the side surfaces of the sidewall insulating layers 412a and 412b. The shapes of the source electrode layer 406a and the drain electrode layer 406b depend on the conditions of the polishing treatment for removing the conductive film 406, and in some cases, as described in this embodiment, the source electrode layer 406a and the drain electrode layer 406b are depressed in the film thickness direction from top surfaces of the sidewall insulating layers 412a and 412b and the upper insulating layer 413 on which polishing treatment has been performed. However, depending on the conditions of the polishing treatment, the height of each of the top surfaces of the source electrode layer 406a and the drain electrode layer 406b is almost equal to that of each of the top surfaces of the sidewall insulating layers 412a and 412b and the upper insulating layer 413 in some cases.

Figure 5B:
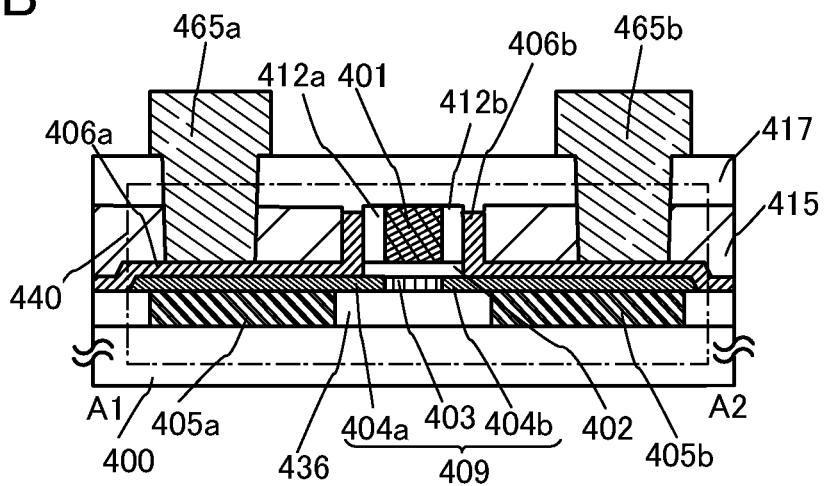

Further, in a step for removing the conductive film 406, as illustrated in FIG. 5B, a transistor 440 may have a structure in which the upper insulating layer 413 is removed completely, and the gate electrode layer 401 is exposed. Further, part of the gate electrode layer 401 may also be removed. As in the transistor 440, a structure in which the gate electrode layer 401 is exposed can be used for an integrated circuit in which another wiring or semiconductor element is stacked over the transistor 440.

Figure 4A:
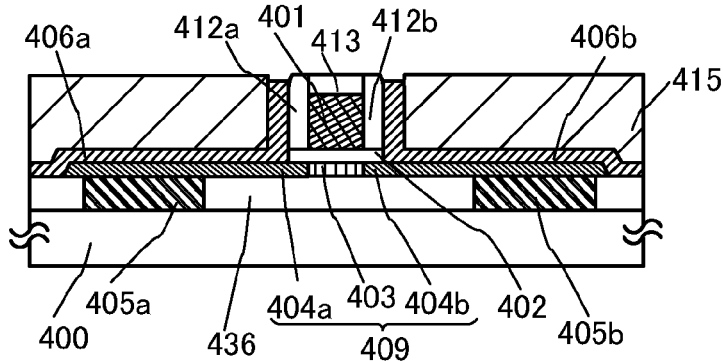
FIGS. 4A to 4D illustrate a method for manufacturing a semiconductor device of one embodiment of the present invention.
Figure 4B:
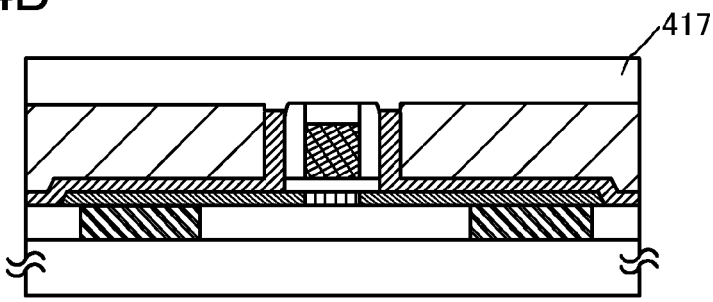

Next, the insulating layer 417 is formed over the insulating layer 415, the source electrode layer 406a, the drain electrode layer 406b, and the upper insulating layer 413 (see FIG. 4B). The insulating layer 417 can be formed using a material and a method similar to those of the upper insulating layer 413. When an highly dense inorganic insulating film (typically, an aluminum oxide film or the like) is used as the insulating layer 417, the insulating layer 417 functions as a protective insulating film of the transistor 420.

Note that in this embodiment, the insulating layer 417 has a stacked-layer structure of a 50-nm-thick aluminum oxide film formed by a sputtering method and a 350-nm-thick silicon oxynitride film formed by a CVD method.

After the aluminum oxide film is formed, heat treatment may be performed. An aluminum oxide film has a function of preventing entry of water or hydrogen into an oxide semiconductor layer and a function of preventing oxygen detachment from an oxide semiconductor layer. Thus, when the oxide semiconductor layer 409 or an insulating layer in contact with the oxide semiconductor layer 409 has a region containing oxygen which exceeds the stoichiometric composition (also referred to as an oxygen-excess region), at least one oxygen-excess region can be provided in the oxide semiconductor layer or at the interface of the oxide semiconductor layer with the insulating layer by performing heat treatment while an aluminum oxide film is provided.

Figure 4C:
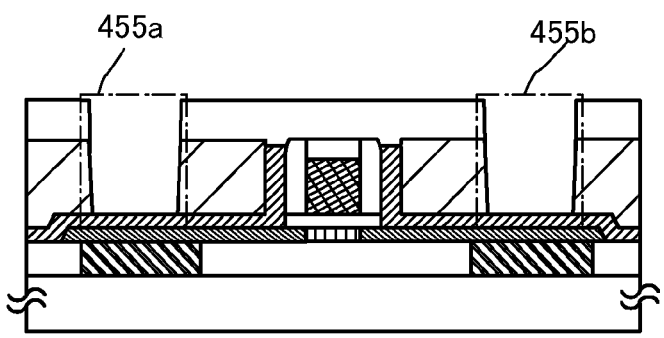

Next, an opening 455a which penetrates through the insulating layer 417 and the insulating layer 415 and reaches the source electrode layer 406a is formed in a region overlapping with the electrode layer 405a, and an opening 455b which penetrates through the insulating layer 417 and the insulating layer 415 and reaches the drain electrode layer 406b is formed in a region overlapping with the electrode layer 405b (see FIG. 4C). The openings are formed by selective etching using a mask or the like. Dry etching, wet etching, or both wet etching and dry etching can be used to form the openings. Further, the shapes of the openings are not particularly restricted as long as the openings reach the source electrode layer 406a and the drain electrode layer 406b. Note that the tapered shape as illustrated in FIG. 4C is preferable because the wiring layer to be formed later can be formed without disconnection. In this embodiment, the openings are formed by a dry etching method.

In a step of forming the openings 455a and 455b, the source electrode layer 406a, the drain electrode layer 406b, or the oxide semiconductor layer 409 may be etched by etching of the insulating layer 417 and the insulating layer 415, so that the source electrode layer 406a, the drain electrode layer 406b, or the oxide semiconductor layer 409 is reduced in film thickness in some cases. In the transistor of this embodiment, the openings 455a and 455b are formed in regions overlapping with the electrode layers 405a and 405b, respectively. Therefore, the wiring layers can be electrically connected to the oxide semiconductor layer 409 even when the film thickness of the source electrode layer 406a, the drain electrode layer 406b, or the oxide semiconductor layer 409 is reduced by etching.

Figure 4D:
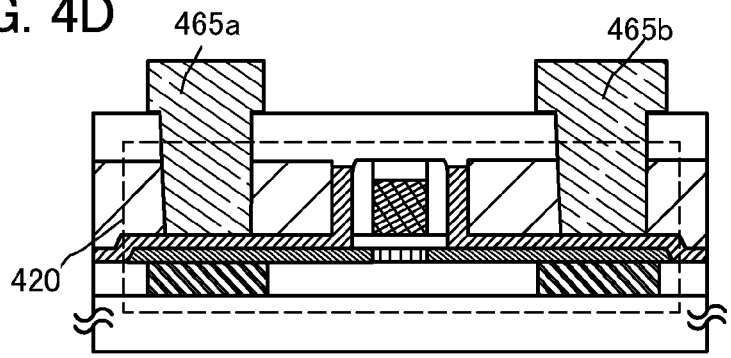

Subsequently, the wiring layers 465a and 465b are formed over the openings 455a and 455b and the insulating layer 417 using a conductive material (see FIG. 4D). For the wiring layers 465a and 465b, a material which is substantially the same as the material used for the gate electrode layer 401 described above can be used. In this embodiment, a 50-nm-thick titanium film, a 100-nm-thick aluminum film, and a 50-nm-thick titanium film are formed in this order by a sputtering method.

Through the above-described steps, the transistor 420 can be manufactured.

In the process for manufacturing the transistor described in this embodiment, the conductive film 406 provided over the gate electrode layer 401, the upper insulating layer 413, and the sidewall insulating layers 412a and 412b is removed by chemical mechanical polishing treatment, so that the conductive film 406 is divided; thus, the source electrode layer 406a and the drain electrode layer 406b are formed.

Further, the source electrode layer 406a and the drain electrode layer 406b are provided in contact with the top surface of the oxide semiconductor layer 409 and the sidewall insulating layers 412a and 412b. The distance (minimum distance) between the gate electrode layer 401 and the region (contact region) in which the oxide semiconductor layer 409 is in contact with the source electrode layer 406a or the drain electrode layer 406b corresponds to a width of the sidewall insulating layer 412a or 412b in the channel length direction, whereby the further miniaturization can be achieved and variation in the minimum distance in the manufacturing process can be suppressed.

Accordingly, the distance between the gate electrode layer 401 and the region in which the oxide semiconductor layer 409 is in contact with the source electrode layer 406a or the drain electrode layer 406b can be made short, so that the resistance between the gate electrode layer 401 and the region in which the oxide semiconductor layer 409 is in contact with the source electrode layer 406a or the drain electrode layer 406b is reduced; thus, the on-state characteristics of the transistor 420 can be improved.

Further, precise processing can be performed accurately because an etching step using a resist mask is not performed in a step for removing the conductive film 406 over the gate electrode layer 401, which is one step of the formation process of the source electrode layer 406a and the drain electrode layer 406b. Consequently, in a process for manufacturing the semiconductor device, the transistor having a miniaturized structure with less variation in shape or characteristics can be manufactured with high yield.

Further, in a semiconductor device described in this embodiment, low-resistance regions are formed by introducing an impurity element into an oxide semiconductor layer, and the low-resistance regions serve as a source region and a drain region which are in contact with a source electrode layer and a drain electrode layer. Accordingly, the contact resistance between the oxide semiconductor layer and each of the source and drain electrode layers can be reduced. When the electrode layers 405a and 405b are provided under the source region and the drain region, the source region and the drain region can be thicker, the resistances of the source region and the drain region can be reduced, and the on-state characteristics of the transistor can be improved.

Although not shown, an insulating layer may be further provided over the transistor 420. As the insulating layer, a single layer or a stack of one or more inorganic insulating films, typical examples of which are a silicon oxide film, a silicon oxynitride film, an aluminum oxide film, an aluminum oxynitride film, a hafnium oxide film, a gallium oxide film, a silicon nitride film, an aluminum nitride film, a silicon nitride oxide film, and an aluminum nitride oxide film, can be used.

A heating step may be additionally performed after the insulating layer is formed. For example, a heating step may be performed at a temperature of higher than or equal to 100° C. and lower than or equal to 200° C. in the air for longer than or equal to 1 hour and shorter than or equal to 30 hours. This heating step may be performed at a fixed heating temperature. Alternatively, the following change in the heating temperature may be conducted plural times repeatedly: the heating temperature is increased from room temperature to a temperature of higher than or equal to 100° C. and lower than or equal to 200° C. and then decreased to room temperature.

In addition, a planarization insulating film may be formed in order to reduce surface unevenness caused by the transistor 420. As the planarization insulating film, an organic material such as polyimide, acrylic, or a benzocyclobutene-based resin can be used. Other than such organic materials, it is also possible to use a low dielectric constant material (low-k material) or the like. Note that the planarization insulating film may be formed by stacking a plurality of insulating films formed from these materials.

This embodiment can be combined with any of the other embodiments as appropriate.

(Embodiment 2)

Figure 6A:
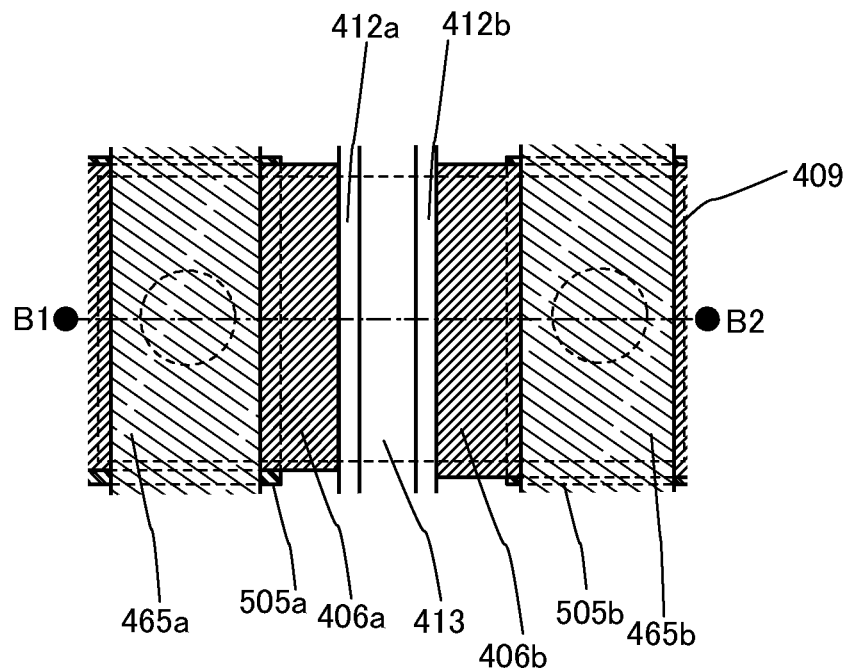
FIGS. 6A and 6B are a top view and a cross-sectional view, respectively, illustrating a semiconductor device of one embodiment of the present invention.
Figure 6B:
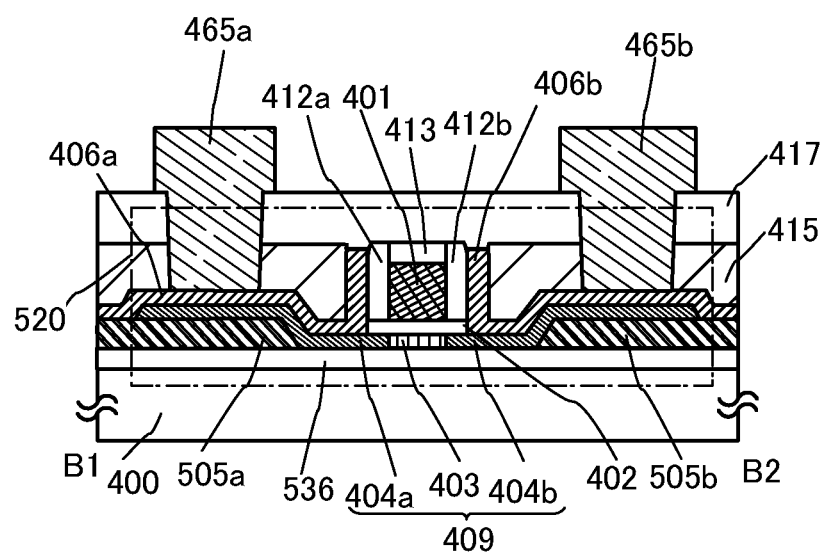

In this embodiment, semiconductor devices of embodiments of the present invention which are different from the semiconductor devices described in Embodiment 1 are described. Note that only the difference between Embodiments 1 and 2 is described in this embodiment. FIGS. 6A and 6B illustrate a transistor of this embodiment. FIG. 6A is a top view illustrating a transistor of one embodiment of the present invention, and FIG. 6B is a cross-sectional view taken along dashed-dotted line B1-B2 in FIG. 6A.

A semiconductor device including a transistor 520 includes, over the substrate 400, a base insulating layer 536;

an electrode layer 505a and an electrode layer 505b over the base insulating layer 536; the oxide semiconductor layer 409 including the low-resistance regions 404a and 404b which are in contact with the electrode layers 505a and 505b, respectively, and the channel formation region 403 which is formed over the base insulating layer 536 and is sandwiched by the low-resistance region 404a and the low-resistance region 404b; the gate insulating layer 402 over the oxide semiconductor layer 409; the gate electrode layer 401 over the gate insulating layer 402; the sidewall insulating layers 412a and 412b which cover side surfaces of the gate electrode layer 401; an upper insulating layer 413 covering a top surface of the gate electrode layer 401; the source electrode layer 406a and the drain electrode layer 406b which are over the base insulating layer 536 and the oxide semiconductor layer 409 and which are in contact with the side surface of the sidewall insulating layer 412a and the side surface of the sidewall insulating layer 412b, respectively; an insulating layer 415 over the source electrode layer 406a and the drain electrode layer 406b; an insulating layer 417 over the insulating layer 415, the source electrode layer 406a, the drain electrode layer 406b, the sidewall insulating layers 412a and 412b, and the upper insulating layer 413; and the wiring layer 465a and the wiring layer 465b which are in contact with the source electrode layer 406a and the drain electrode layer 406b, respectively, through openings provided in the insulating layer 415 and the insulating layer 417.

The low-resistance regions 404a and 404b are in contact with the electrode layers 505a and 505b, respectively. The electrode layers 505a and 505b are formed using metal, a metal compound, a conductive metal compound, a semiconductor, or the like. The low-resistance regions 404a and 404b function as a source region and a drain region of the transistor 520. The electrode layers 505a and 505b are provided under the source region and the drain region, so that the source region and the drain region can be thicker, the resistances of the source region and the drain region can be reduced, and the on-state characteristics of the transistor can be improved.

The transistor 520 described in this embodiment is different from the transistor 420 described in Embodiment 1 in that the electrode layers 505a and 505b are formed over the base insulating layer. The transistor 520 can be manufactured with a smaller number of steps than the transistor 420 because the electrode layers 505a and 505b are not embedded in the base insulating layer.

A method of manufacturing the transistor 520 is described.

First, the base insulating layer 536 is formed over the substrate 400. The base insulating layer 536 can be formed using a material and a method similar to those of the base insulating layer 436 described in Embodiment 1.

Next, a conductive film to be the electrode layers 505a and 505b is formed and selectively etched by a photolithography step, so that the electrode layers 505a and 505b are formed.

The conductive film to be the electrode layers 505a and 505b can be formed using a material and a method similar to those of the electrode layers 405a and 405b described in Embodiment 1. The both end portions of the electrode layers 505a and 505b are preferably tapered in consideration of the coverage with the oxide semiconductor layer 409 to be formed later. The electrode layers 505a and 505b preferably have a thickness with which the electrode layers 505a and 505b can be sufficiently covered with the oxide semiconductor layer 409.

Here, the conductive film may be subjected to nitrogen plasma treatment before the formed conductive film is processed to form the island-shaped electrode layers 505a and 505b. By performing nitrogen plasma treatment, the contact resistance between the oxide semiconductor layer 409 to be formed later and each of the electrode layers 505a and 505b can be reduced.

Figure 7:
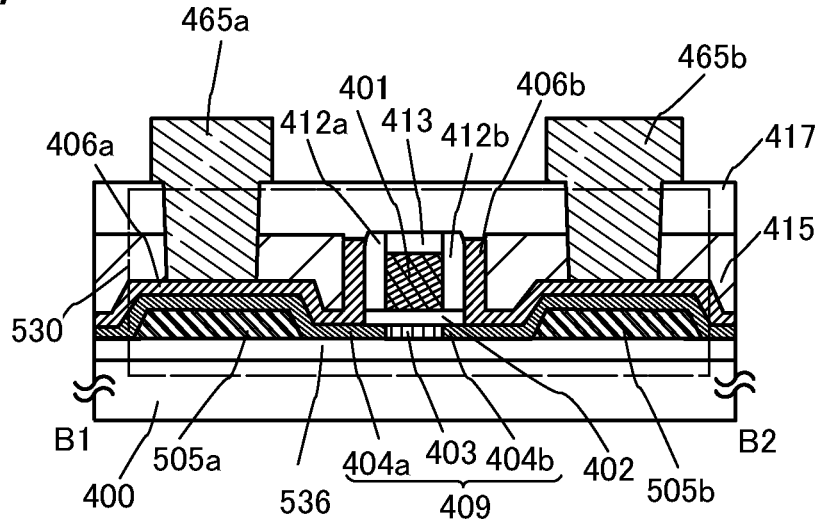
FIG. 7 is a cross-sectional view illustrating a semiconductor device of one embodiment of the present invention.

Next, an oxide semiconductor film is formed over the base insulating layer 536, the electrode layer 505a, and the electrode layer 505b, and is processed by etching to form the island-shaped oxide semiconductor layer 409. The oxide semiconductor layer 409 does not need to cover the electrode layers 505a and 505b completely, and may be at least partly in contact with the electrode layers 505a and 505b as in the transistor 520 illustrated in FIG. 6B. Further, as in a transistor 530 illustrated in FIG. 7, the oxide semiconductor layer 409 may cover the electrode layers 505a and 505b completely.

By adjusting the contact area between the oxide semiconductor layer 409 and each of the electrode layers 505a and 505b as appropriate, the contact resistance between the oxide semiconductor layer 409 and each of the electrode layers 505a and 505b can be set as appropriate. A region of the electrode layer 505a and a region of the electrode layer 505b which are not covered with the oxide semiconductor layer 409 may be in contact with the source electrode layer 406a and the drain electrode layer 406b which are to be formed later, respectively.

The oxide semiconductor layer 409 can be formed using a material and a method similar to those in Embodiment 1. The oxide semiconductor layer 409 preferably has a thickness large enough to prevent disconnection caused by the electrode layers 505a and 505b.

A method similar to that of the transistors described in Embodiment 1 is used for forming the gate electrode layer 401, the upper insulating layer 413, the sidewall insulating layer 412a, the sidewall insulating layer 412b, the source electrode layer 406a, the drain electrode layer 406b, the insulating layer 415, the insulating layer 417, and the wiring layers 465a and 465b. Embodiment 1 can be referred to for the details; thus, description thereof is omitted here.

In the process for manufacturing the transistor described in this embodiment, the conductive film 406 provided over the gate electrode layer 401, the upper insulating layer 413, and the sidewall insulating layers 412a and 412b is removed by chemical mechanical polishing treatment, so that the conductive film 406 is divided; thus, the source electrode layer 406a and the drain electrode layer 406b are formed.

Further, the source electrode layer 406a and the drain electrode layer 406b are provided in contact with the top surface of the oxide semiconductor layer 409, and the sidewall insulating layers 412a and 412b. The distance (minimum distance) between the gate electrode layer 401 and the region (contact region) in which the oxide semiconductor layer 409 is in contact with the source electrode layer 406a or the drain electrode layer 406b corresponds to a width of the sidewall insulating layer 412a or 412b in the channel length direction, whereby the further miniaturization can be achieved and variation in the minimum distance in the manufacturing process can be suppressed.

Accordingly, the distance between the gate electrode layer 401 and the region in which the oxide semiconductor layer 409 is in contact with the source electrode layer 406a or the drain electrode layer 406b can be made short, so that the resistance between the channel formation region 403 and the region in which the oxide semiconductor layer 409 is in contact with the source electrode layer 406a or the drain electrode layer 406b is reduced; thus, the on-state characteristics of the transistor 520 can be improved.

Further, precise processing can be performed accurately because an etching step using a resist mask is not performed in a step for removing the conductive film 406 over the gate electrode layer 401, which is one step of the formation process of the source electrode layer 406a and the drain electrode layer 406b. Consequently, in a process for manufacturing the semiconductor device, a transistor having a miniaturized structure with less variation in shape or characteristics can be manufactured with high yield.

Further, in the semiconductor device described in this embodiment, the electrode layers 405a and 405b are provided under the source region and the drain region of the oxide semiconductor layer, so that the source region and the drain region can be thicker, the resistances of the source region and the drain region can be reduced, and the on-state characteristics of the transistor can be improved.

This embodiment can be combined with any of the other embodiments as appropriate.

(Embodiment 3)

In this embodiment, an example of a semiconductor device which includes any of the transistors described in Embodiments 1 and 2, which can hold stored data even when not powered, and which does not have a limitation on the number of write cycles, is described with reference to drawings. Note that the semiconductor device in this embodiment includes any of the transistors described in Embodiments 1 and 2 as a transistor 162. Any of the structures of the transistors described in Embodiments 1 and 2 can be used as the transistor 162.

Figure 8A:
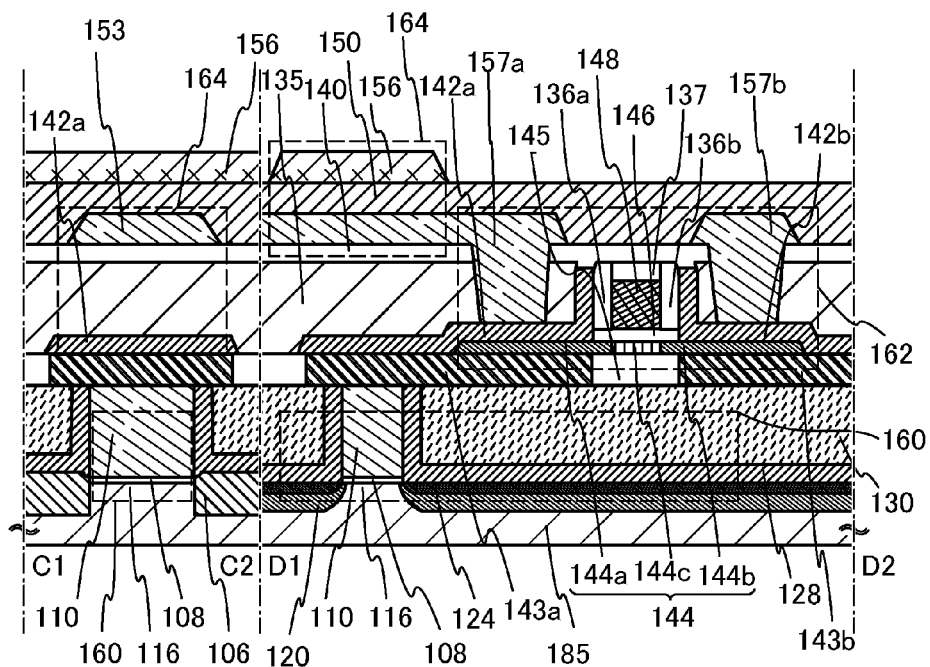
FIGS. 8A to 8C are a cross-sectional view, a top view, and a circuit diagram illustrating one embodiment of a semiconductor device.
Figure 8B:
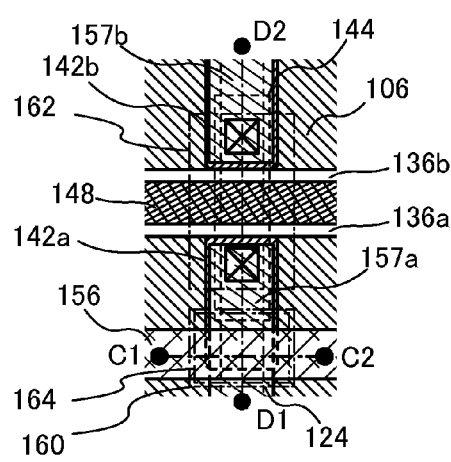
Figure 8C:
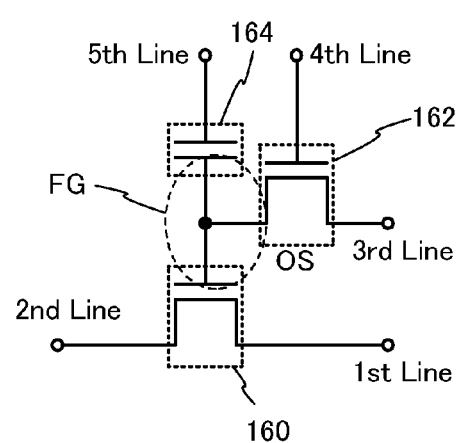

FIGS. 8A to 8C illustrate an example of a structure of a semiconductor device. FIG. 8A is a cross-sectional view of the semiconductor device, FIG. 8B is a top view of the semiconductor device, and FIG. 8C is a circuit diagram of the semiconductor device. Here, FIG. 8A corresponds to a cross section along line C1-C2 and line D1-D2 in FIG. 8B. Note that in FIG. 8B, some components of the semiconductor device illustrated in FIG. 8A are omitted for clarity.

The semiconductor device illustrated in FIGS. 8A and 8B includes a transistor 160 including a first semiconductor material in a lower portion, and a transistor 162 including a second semiconductor material in an upper portion. The transistor 162 can have the same structure as any of the structures described in Embodiment 1 and 2.

Here, the first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A transistor including a material other than an oxide semiconductor can operate at high speed easily. On the other hand, charge can be held in a transistor including an oxide semiconductor for a long time owing to its characteristics.

Although all the transistors are n-channel transistors here, p-channel transistors can be used. In addition, because the technical nature of the disclosed invention is to use an oxide semiconductor in the transistor 162 so that data can be stored, it is not necessary to limit a specific structure of the semiconductor device, such as a material of the semiconductor device or a structure of the semiconductor device, to the structure described here.

The transistor 160 in FIG. 8A includes a channel formation region 116 provided in a substrate 185 containing a semiconductor material (e.g., silicon), impurity element regions 120 provided so that the channel formation region 116 is sandwiched therebetween, intermetallic compound regions 124 in contact with the impurity element regions 120, a gate insulating layer 108 provided over the channel formation region 116, and a gate electrode layer 110 provided over the gate insulating layer 108. Note that a transistor whose source electrode layer and drain electrode layer are not illustrated in a drawing may be referred to as a transistor for the sake of convenience. Further, in such a case, in description of a connection of a transistor, a source region and a source electrode layer are collectively referred to as a "source electrode layer," and a drain region and a drain electrode layer are collectively referred to as a "drain electrode layer". That is, in this specification, the term "source electrode layer" may include a source region.

Further, an element isolation insulating layer 106 is formed on the substrate 185 to surround the transistor 160, and an insulating layer 130 is formed to cover the transistor 160. In order to realize high integration, the transistor 160 preferably has a structure without a sidewall insulating layer as illustrated in FIG. 8A. On the other hand, in the case where the characteristics of the transistor 160 are important, the sidewall insulating layers may be formed on side surfaces of the gate electrode layer 110, and the impurity element regions 120 may include regions having different impurity element concentrations.

The transistor 162 illustrated in FIG. 8A includes an oxide semiconductor in the channel formation region. Here, an oxide semiconductor layer 144 included in the transistor 162 is preferably highly purified. By using a highly purified oxide semiconductor, the transistor 162 which has extremely favorable off-state current characteristics can be obtained. Any of the transistors described in Embodiments 1 and 2 can be applied to the transistor 162.

Since the off-state current of the transistor 162 is small, stored data can be held for a long time owing to such a transistor. In other words, power consumption can be sufficiently reduced because a semiconductor device in which refresh operation is unnecessary or the frequency of refresh operation is extremely low can be provided.

The transistor 162 includes, over and in contact with the insulating layer 130, an electrode layer 143a in contact with the gate electrode layer 110, an electrode layer 143b, and an insulating layer 145 in which the electrode layers 143a and 143b are embedded.

By CMP treatment performed when top surfaces of the electrode layers 143a and 143b is exposed form the insulating layer 145, planarization treatment can be performed on a surface on which the oxide semiconductor layer 144 is to be formed. The surface on which the oxide semiconductor layer 144 is to be formed is sufficiently planarized (the average surface roughness of the top surfaces of the electrode layer and the base insulating layer is preferably less than or equal to 0.15 nm), so that the oxide semiconductor layer 144 having excellent crystallinity can be formed, and the transistor 162 can have favorable characteristics.

In the process for manufacturing the transistor 162, a conductive film provided over a gate insulating layer 146, a gate electrode layer 148, an insulating film 137, and sidewall insulating layers 136a and 136b is removed by chemical mechanical polishing treatment to form electrode layers 142a and 142b.

Accordingly, in the transistor 162, the distance between the gate electrode layer 148 and a region (contact region) in which the oxide semiconductor layer 144 is in contact with the electrode layer 142a or the electrode layer 142b which functions as a source or drain electrode layer can be made short, so that the resistance between a channel formation region 144c and the region (contact region) in which the oxide semiconductor layer 144 is in contact with the electrode layer 142a or the electrode layer 142b is reduced; thus, the on-state characteristics of the transistor 162 can be improved.

Precise processing can be performed accurately because an etching step using a resist mask is not performed in a step for removing the conductive film which overlaps the gate electrode layer 148, which is one step of the formation process of the electrode layers 142a and 142b. Consequently, in a process for manufacturing the semiconductor device, a transistor having a miniaturized structure with less variation in shape or characteristics can be manufactured with high yield.

An insulating layer 135 and an insulating layer 140 are provided over the electrode layers 142a and 142b. Through openings provided in the insulating layer 135 and the insulating layer 140, a wiring layer 157a is provided in contact with the electrode layer 142a which functions as a source or drain electrode layer, and a wiring layer 157b is provided in contact with the electrode layer 142b which functions as a source or drain electrode layer. Further, the wiring layers 157a and 157b are provided to overlap with the electrode layers 143a and 143b, respectively.

The oxide semiconductor layer 144 is in contact with the electrode layer 142a and the electrode layer 142b which function as the source electrode layer and the drain electrode layer while the electrode layer 142a and the electrode layer 142b overlap with the electrode layers 143a and 143b, respectively; thus, the thickness of the source region and the drain region of the transistor can be made greater, the contact resistance between the oxide semiconductor layer 144 and each of the source and drain electrode layers can be reduced, and the transistor 162 can have favorable on-state characteristics.

Further, the oxide semiconductor layer 144 is subjected to treatment for introducing an impurity element. By performing the treatment for introducing an impurity element into the oxide semiconductor layer 144 using the gate electrode layer 148 as a mask, a low-resistance region 144a, a low-resistance region 144b, and the channel formation region 144c are formed in a self-aligned manner in the oxide semiconductor layer 144.

The low-resistance region 144a and the low-resistance region 144b have higher impurity element concentrations than the channel formation region 144c. When the impurity element concentration is made high, carrier density in the oxide semiconductor layer 144 is increased and the contact resistance between the oxide semiconductor layer 144 and each of the electrode layers 142a and 142b is reduced. Accordingly, on-state current or mobility can be improved and high-speed response can be achieved.

An insulating layer 150 is provided over the transistor 162. Further, an electrode layer 156 is provided in a region which is over the insulating layer 150 and overlaps with the wiring layer 157a. A capacitor 164 includes the electrode layer 156, the insulating layer 150, and the wiring layer 157a. That is, the source electrode layer 157a of the transistor 162 functions as one electrode of the capacitor 164, and the electrode layer 156 functions as the other electrode of the capacitor 164. Note that the capacitor 164 may be omitted if a capacitor is not needed. Alternatively, the capacitor 164 may be separately provided above the transistor 162.

In FIGS. 8A and 8B, the transistor 160 is provided to overlap with at least part of the transistor 162. The source region or the drain region of the transistor 160 is preferably provided to overlap with part of the oxide semiconductor layer 144. Further, the transistor 162 and the capacitor 164 are provided to overlap with at least part of the transistor 160. With such a planar layout, the area occupied by the semiconductor device can be reduced; thus, higher integration can be achieved.

Next, an example of a circuit configuration corresponding to FIGS. 8A and 8B is illustrated in FIG. 8C.

In FIG. 8C, a first line (1st Line) is electrically connected to a source electrode layer of the transistor 160. A second line (2nd Line) is electrically connected to a drain electrode layer of the transistor 160. A third line (a 3rd line) and one of source or drain electrode layers of the transistor 162 are electrically connected to each other, and a fourth line (a 4th line) and a gate electrode layer of the transistor 162 are electrically connected to each other. A gate electrode layer of the transistor 160 and the other of the source electrode layer and the drain electrode layer of the transistor 162 are electrically connected to one electrode of a capacitor 164, and a fifth line (a 5th line) and the other electrode of the capacitor 164 are electrically connected to each other.

The semiconductor device in FIG. 8C utilizes a characteristic in which the potential of the gate electrode layer of the transistor 160 can be held, and thus enables data writing, holding, and reading as follows.

Writing and holding of data are described. First, the potential of the fourth line is set to a potential at which the transistor 162 is turned on, so that the transistor 162 is turned on. Accordingly, the potential of the third line is supplied to the gate electrode layer of the transistor 160 and the capacitor 164. That is, a predetermined charge is given to the gate electrode layer of the transistor 160 (writing). Here, one of two kinds of charges providing different potential levels (hereinafter referred to as a low-level charge and a high-level charge) is applied. After that, the potential of the fourth line is set to a potential at which the transistor 162 is turned off, so that the transistor 162 is turned off. Thus, the charge given to the gate electrode layer of the transistor 160 is held (holding).

Since the off-state current of the transistor 162 is extremely small, the charge of the gate electrode layer of the transistor 160 is held for a long time.

Next, reading of data is described. By supplying an appropriate potential (reading potential) to the fifth line while a predetermined potential (constant potential) is supplied to the first line, the potential of the second line varies depending on the amount of charge held in the gate electrode layer of the transistor 160. This is because in general, when the transistor 160 is an n-channel transistor, an apparent threshold voltage $V_{th\_H}$ in the case where a high level charge is given to the gate electrode layer of the transistor 160 is lower than an apparent threshold voltage $V_{th\_L}$ in the case where a low level charge is given to the gate electrode layer of the transistor 160. Here, an apparent threshold voltage refers to the potential of the fifth line, which is needed to turn on the transistor 160. Thus, the potential of the fifth line is set to a potential $V_0$ which is between $V_{th\_H}$ and $V_{th\_L}$, whereby charge given to the gate electrode layer of the transistor 160 can be determined. For example, in the case where a high level charge is given in writing, when the potential of the fifth line is set to $V_0 (>V_{th\_H})$, the transistor 160 is turned on. In the case where a low level charge is given in writing, even when the potential of the fifth line is set to $V_0 (<V_{th\_L})$, the transistor 160 remains in an off state. Therefore, the stored data can be read by the potential of the second line.

Note that in the case where memory cells are arrayed to be used, only data of desired memory cells needs to be read. In the case of a memory cell in which reading is not performed, a potential at which the transistor 160 is turned off, that is, a potential smaller than $V_{th\_H}$ may be given to the fifth line regardless of the state of the gate electrode layer of the transistor 160. Alternatively, a potential which allows the transistor 160 to be turned on regardless of a state of the gate electrode layer, that is, a potential higher than $V_{th\_L}$ may be applied to the fifth line.

When a transistor having a channel formation region formed using an oxide semiconductor and having extremely small off-state current is applied to the semiconductor device in this embodiment, the semiconductor device can store data for an extremely long period. In other words, power consumption can be adequately reduced because refresh operation becomes unnecessary or the frequency of refresh operation can be extremely low. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional non-volatile memory, it is not necessary to inject and extract electrons into and from a floating gate; thus, the problem of deterioration of a gate insulating layer does not occur. In other words, the semiconductor device according to one embodiment of the disclosed invention does not have a limit on the number of times of writing which is a problem in a conventional nonvolatile memory, and reliability thereof is drastically improved. Furthermore, data is written depending on the on state and the off state of the transistor, whereby high-speed operation can be easily realized.

Figure 9A:
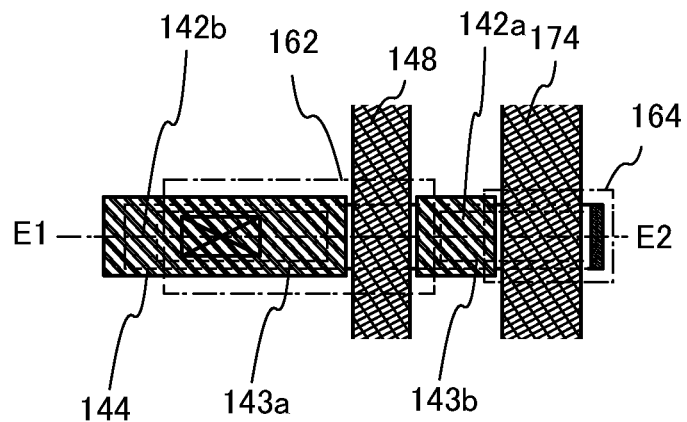
FIGS. 9A and 9B are a top view and a cross-sectional view, respectively, illustrating one embodiment of a semiconductor device.
Figure 9B:
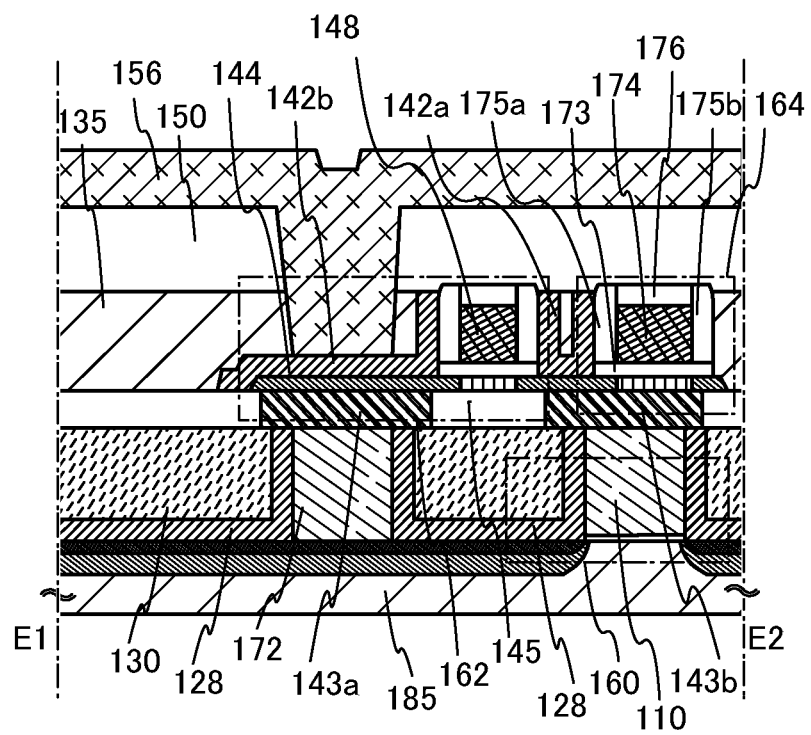

FIGS. 9A and 9B illustrate another example of the structure of the semiconductor device. FIGS. 9A and 9B are a top view and a cross-sectional view of the semiconductor device, respectively. Here, FIG. 9B corresponds to a cross section along line E1-E2 in FIG. 9A. Note that in FIG. 9A, some components of the semiconductor device illustrated in FIG. 9B are omitted for clarity.

A semiconductor device illustrated in FIGS. 9A and 9B includes the transistor 162 in which a channel is formed in an oxide semiconductor layer, the transistor 160 in which a channel is formed in a layer of a semiconductor material other than an oxide semiconductor (e.g., silicon), and the capacitor 164. The structures of the transistors 162 and 160 are similar to that of the semiconductor device illustrated in FIGS. 8A and 8B; thus, detailed description thereof is omitted here.

In FIGS. 9A and 9B, the capacitor 164 includes the electrode layer 143b, the oxide semiconductor layer 144, an insulating layer 173, and a conductive layer 174. The conductive layer 174 is formed in the same step as the gate electrode layer 148, and a top surface of the conductive layer 174 is covered with the insulating film 176 and side surfaces of the conductive layer 174 are covered with sidewall insulating layers 175a and 175b.

By introducing an impurity element into the oxide semiconductor layer 144 using the gate electrode layer 148 and the conductive layer 174 as masks, low-resistance regions are formed in a self-aligned manner in a region of the oxide semiconductor layer 144 which does not overlap with the gate electrode layer 148 and the conductive layer 174. The electrode layers 142a and 142b functioning as a source electrode layer and a drain electrode layer are in contact with the low-resistance regions of the oxide semiconductor layer 144 and function as a source region and a drain region of the transistor 162; thus, the contact resistance between the oxide semiconductor layer 144 and each of the source and drain electrode layers can be reduced.

The electrode layers 143a and 143b are provided under and in contact with the low-resistance regions functioning as a source region and a drain region. Thus, the thickness of the source region and the drain region is increased, and the contact resistance between the oxide semiconductor layer 144 and each of the source and drain electrode layers is reduced.

The electrode layer 142b of the transistor 162 is electrically connected to the electrode layer 156 in an opening which is formed in the insulating layer 135 and the insulating layer 150 and reaches the electrode layer 142b. A conductive layer 172 is formed under and in contact with the electrode layer 143a, and a source electrode layer or a drain electrode layer of the transistor 160 is electrically connected with a source electrode layer or a drain electrode layer of the transistor 162.

As illustrated in FIGS. 9A and 9B, the transistor 160, the transistor 162, and the capacitor 164 are closely stacked to overlap with each other. Accordingly, the area occupied by the semiconductor device can be reduced; thus, higher integration can be achieved.

In the transistor 162 described in this embodiment, the electrode layer is formed under and in contact with the oxide semiconductor layer, and treatment for introducing an impurity element into the oxide semiconductor layer using the gate electrode layer as a mask is performed. Thus, the transistor 162 can have favorable electrical characteristics and off-state current can be sufficiently reduced. Then, by using such a transistor, a semiconductor device in which stored data can be stored for an extremely long time can be obtained.

The above transistor has high on-state characteristics (e.g., on-state current) and is capable of high-speed operation and high-speed response. Further, the transistor can be miniaturized. Accordingly, by using the transistor, a high-performance, highly reliable semiconductor device can be provided.

The structures and methods described in this embodiment can be combined as appropriate with any of the structures and methods described in the other embodiments.

(Embodiment 4)

In this embodiment, in a semiconductor device which includes any of the transistors described in Embodiment 1 and 2, which can hold stored data even when not powered, and which does not have a limitation on the number of write cycles, a structure which is different from the structure described in Embodiment 3 is described with reference to FIGS. 10A and 10B, FIG. 11, FIGS. 12A and 12B, and FIGS. 13A and 13B. Note that in a semiconductor device in this embodiment, any of the transistors described in Embodiments 1 and 2 can be used as the transistor 162.

Figure 10A:
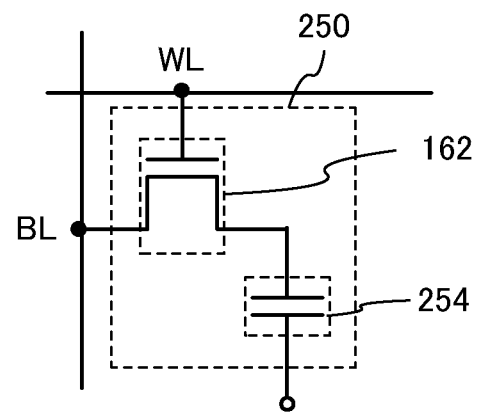
FIGS. 10A and 10B are a circuit diagram and a perspective view, respectively, illustrating one embodiment of a semiconductor device.
Figure 10B:
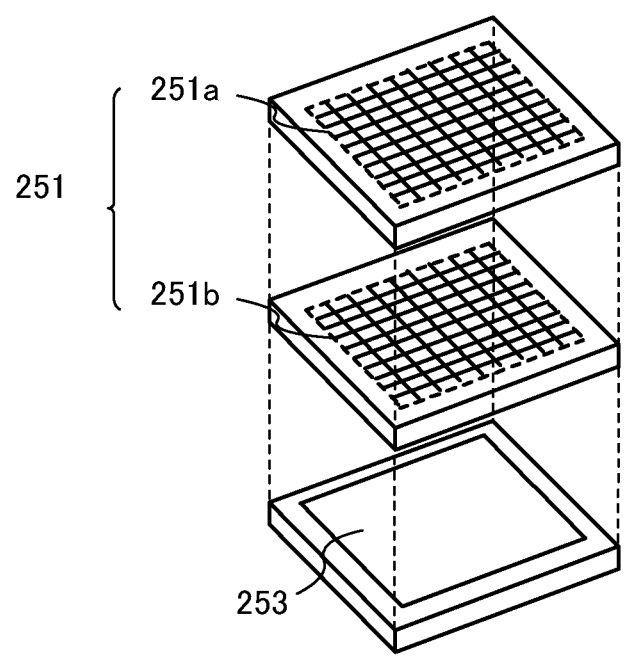

FIG. 10A illustrates an example of a circuit configuration of a semiconductor device, and FIG. 10B is a conceptual diagram illustrating an example of a semiconductor device. First, the semiconductor device illustrated in FIG. 10A is described, and then, the semiconductor device illustrated in FIG. 10B is described below.

In the semiconductor device illustrated in FIG. 10A, a bit line BL is electrically connected to the source electrode or the drain electrode layer of the transistor 162, a word line WL is electrically connected to the gate electrode layer of the transistor 162, and the source electrode layer or the drain electrode layer of the transistor 162 is electrically connected to a first terminal of a capacitor 254.

Off-state current is extremely small in the transistor 162 formed using an oxide semiconductor. For that reason, a potential of the first terminal of the capacitor 254 (or a charge accumulated in the capacitor 254) can be held for an extremely long period by turning off the transistor 162.

Next, writing and holding of data in the semiconductor device (a memory cell 250) illustrated in FIG. 10A are described.

First, the potential of the word line WL is set to a potential at which the transistor 162 is turned on, so that the transistor 162 is turned on. Thus, the potential of the bit line BL is supplied to the first terminal of the capacitor 254 (writing). After that, the potential of the word line WL is set to a potential at which the transistor 162 is turned off, so that the transistor 162 is turned off. Thus, the potential of the first terminal of the capacitor 254 is held (holding).

The transistor 162 has extremely small off-state current; thus, a potential of the first terminal of the capacitor 254 (or a charge accumulated in the capacitor 254) can be held for a long period.

Next, reading of data is described. When the transistor 162 is turned on, the bit line BL which is in a floating state and the capacitor 254 are electrically connected to each other, and the charge is redistributed between the bit line BL and the capacitor 254. As a result, the potential of the bit line BL is changed. The amount of change in potential of the bit line BL varies depending on the potential of the first terminal of the capacitor 254 (or the charge accumulated in the capacitor 254).

For example, the potential of the bit line BL after charge redistribution is $(C_B \times V_{B0} + C \times V)/(C_B + C)$, where V is the potential of the first terminal of the capacitor 254, C is the capacitance of the capacitor 254, $C_B$ is the capacitance of the bit line BL (hereinafter also referred to as bit line capacitance), and $VB_0$ is the potential of the bit line BL before the charge redistribution. Therefore, it can be found that assuming that the memory cell 250 is in either of two states in which the potentials of the first terminal of the capacitor 254 are $V_1$ and $V_0$ ($V_1 > V_0$), the potential of the bit line BL in the case of holding the potential $V_1 (=(C_B \times V_{B0} + C \times V_1)/(C_B + C))$ is higher than the potential of the bit line BL in the case of holding the potential $V_0 (=(C_B \times V_{B0} + C \times V_0)/(C_B + C))$.

Then, by comparing the potential of the bit line BL with a predetermined potential, data can be read.

As described above, since the off-state current of the transistor 162 is extremely small, the semiconductor device illustrated in FIG. 10A can hold a charge that is accumulated in the capacitor 254 for a long time. In other words, power consumption can be adequately reduced because refresh operation becomes unnecessary or the frequency of refresh operation can be extremely low. Moreover, stored data can be stored for a long time even when power is not supplied.

Next, the semiconductor device illustrated in FIG. 10B is described.

The semiconductor device illustrated in FIG. 10B includes memory cell arrays 251a and 251b including a plurality of memory cells 250 illustrated in FIG. 10A as memory circuits in an upper portion, and a peripheral circuit 253 in a lower portion which is necessary for operating a memory cell array 251 (the memory cell arrays 251a and 251b). Note that the peripheral circuit 253 is electrically connected to the memory cell array 251.

In the structure illustrated in FIG. 10B, the peripheral circuit 253 can be provided under the memory cell array 251 (the memory cell arrays 251a and 251b). Thus, the size of the semiconductor device can be decreased.

It is preferable that a semiconductor material of the transistor provided in the peripheral circuit 253 be different from that of the transistor 162. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Therefore, a variety of circuits (e.g., a logic circuit or a driver circuit) which needs to operate at high speed can be favorably realized by the transistor.

Note that FIG. 10B illustrates, as an example, the semiconductor device in which two memory cell arrays 251 (the memory cell array 251a and the memory cell array 251b) are stacked; however, the number of memory cell arrays to be stacked is not limited thereto. Three or more memory cell arrays may be stacked.

Next, a specific structure of the semiconductor device illustrated in FIGS. 10A and 10B is described with reference to FIG. 11.

Figure 11:
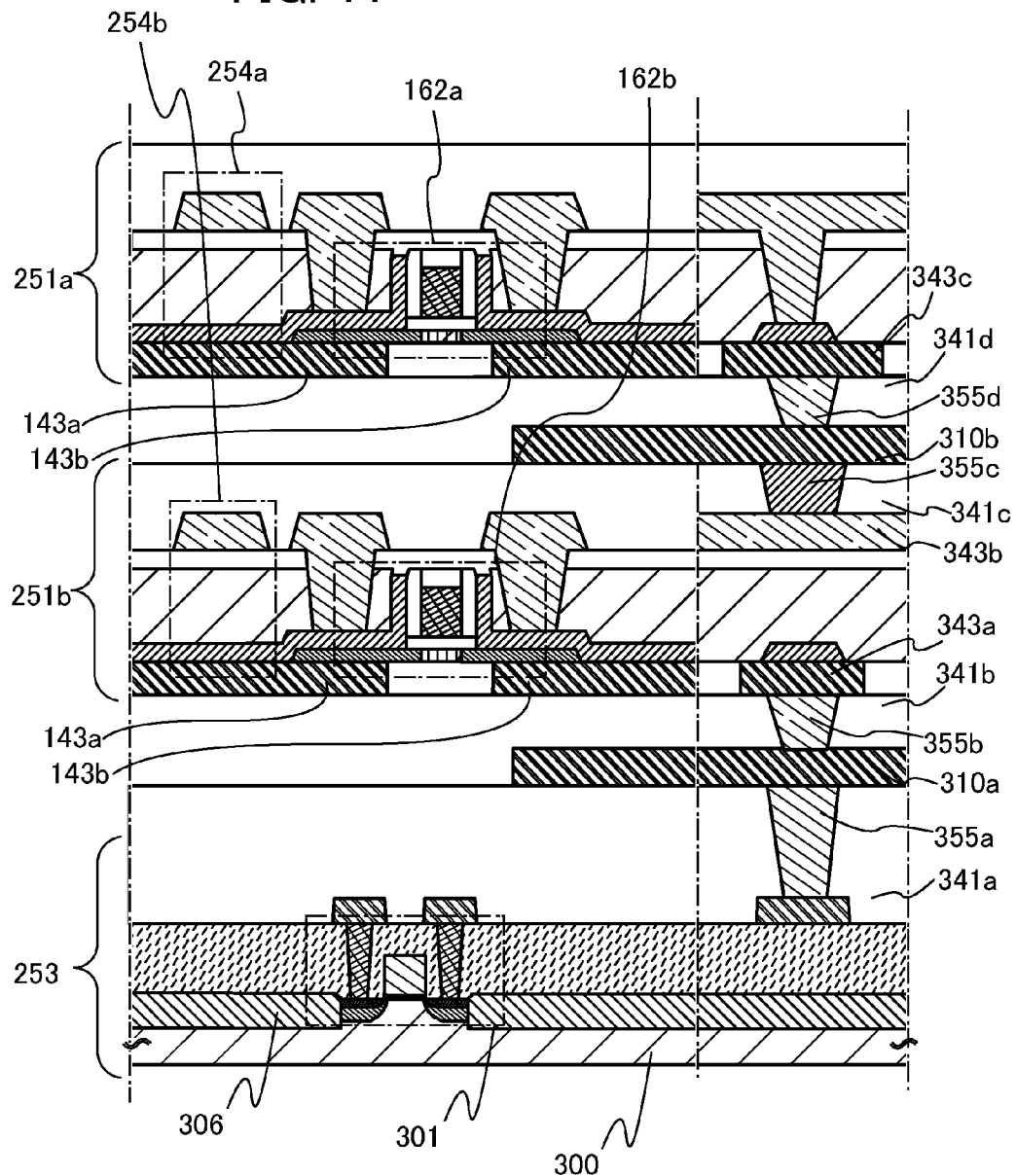
FIG. 11 is a cross-sectional view illustrating one embodiment of a semiconductor device.

FIG. 11 is a cross sectional view of a semiconductor device. The semiconductor device illustrated in FIG. 11 includes a plurality of memory cell arrays 251 stacked in the upper portion and the peripheral circuit 253 in a lower portion. The memory cell arrays 251 and the peripheral circuit 253 are electrically connected to each other. FIG. 11 illustrates the memory cell array 251a and the memory cell array 251b as representative examples of the plurality of memory cell arrays, and the peripheral circuit 253.

A transistor 162a and a capacitor 254a which are included in the memory cell array 251a and an electrode layer 343c which connects the memory cell array 251a and another memory cell are illustrated as representative examples. In the transistor 162a, a channel is formed in an oxide semiconductor layer. Any of the transistors described in Embodiments 1 and 2 can be used as the transistor 162a; thus, description thereof is omitted here. The capacitor 254a includes a source electrode layer of the transistor 162a and an electrode which is formed in the same layer as a wiring layer. The electrode layer 343c is formed in the same layer as the electrode layers 143a and 143b included in the transistor 162a.

A transistor 162b and a capacitor 254b which are included in the memory cell array 251b, an electrode layer 343b which connects the memory cell array 251b and another memory cell, and an electrode layer 343a which connects the memory cell array 251b and the peripheral circuit 253 are illustrated as representative examples. In the transistor 162b, a channel is formed in an oxide semiconductor layer. Any of the transistors described in Embodiments 1 and 2 can be used as the transistor 162b; thus, description thereof is omitted here. The capacitor 254b includes a source electrode layer of the transistor 162b and an electrode which is formed in the same layer as a wiring layer. The electrode layer 343b is formed in the same layer as the wiring layers 157a and 157b included in the transistor 162b. The electrode layer 343a is formed in the same layer as the electrode layers 143a and 143b included in the transistor 162b.

The periphery circuit 253 includes a transistor 301 in which a semiconductor material other than an oxide semiconductor is used for a channel formation region. The transistor 301 has a structure in which element separation insulating layers 306 are formed over a substrate 300 containing a semiconductor material (e.g., silicon) and a channel region is formed in a region sandwiched between the element separation insulating layers 306.

Note that the transistor 301 may have a structure in which a channel is formed in a semiconductor layer, such as a silicon layer formed on an insulating surface, or in a silicon layer of an SOI substrate. A known structure can be used as the structure of the transistor 301.

A wiring layer 310a is provided between the periphery circuit 253 and the memory cell array 251b. An insulating layer 341a is provided between the periphery circuit 253 and the wiring layer 310a. An insulating layer 341b is provided between the wiring layer 310a and the memory cell array 251b. The insulating layer 341a is provided with a wiring layer 355a which electrically connects the periphery circuit 253 and the wiring layer 310a. The insulating layer 341b is provided with a wiring layer 355b which electrically connects the wiring layer 310a and the memory cell array 251b.

Note that the periphery circuit 253 and the memory cell array 251b are electrically connected to each other through the wiring layer 310a here; however, a method for connecting the periphery circuit 253 and the memory cell array 251b is not limited thereto. The periphery circuit 253 and the memory cell array 251b are electrically connected to each other in a region which does not overlap with the transistor 301 and the transistor 162b here; however, the structure is not limited thereto. For example, the electrode layers 143a and 143b included in the transistor 162b may be directly connected to the periphery circuit 253.

A wiring layer 310b is provided between the memory cell array 251a and the memory cell array 251b. The wiring layer 310b is provided over an insulating layer 341c provided in the memory cell array 251b. An insulating layer 341d is provided between the wiring layer 310b and the memory cell array 251a. The insulating layer 341c is provided with a wiring layer 355c which electrically connects the wiring layer 310b and the memory cell array 251b. The insulating layer 341d is provided with a wiring layer 355d which electrically connects the wiring layer 310b and the memory cell array 251a.

When the layout illustrated in FIG. 11 is employed, the area occupied by the semiconductor device can be reduced; thus, the degree of integration can be increased.

Figure 12A:
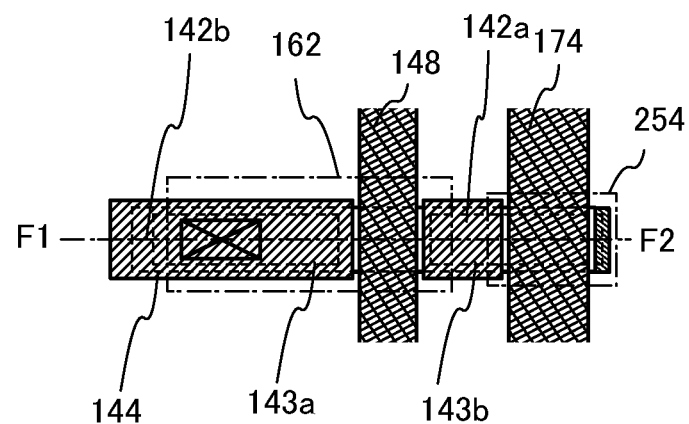
FIGS. 12A and 12B are a top view and a cross-sectional view, respectively, illustrating one embodiment of a semiconductor device.
Figure 12B:
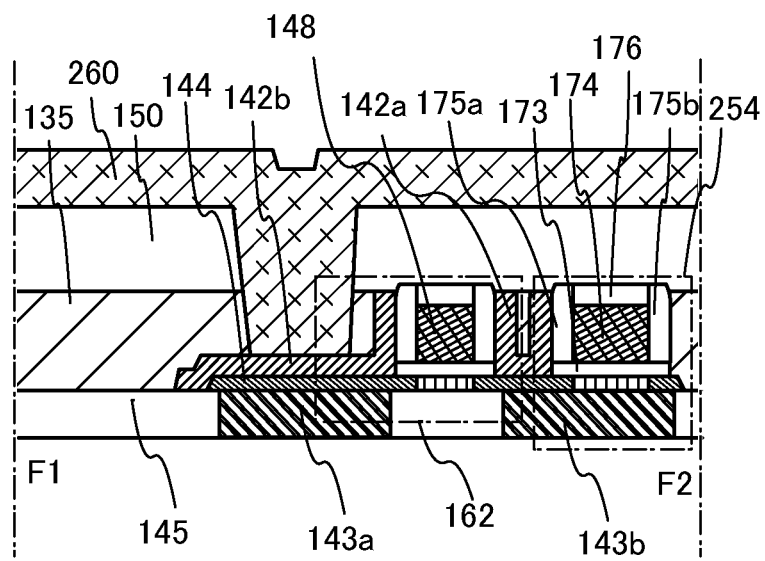

FIGS. 12A and 12B and FIGS. 13A and 13B illustrate other examples of the semiconductor device which can be applied to the memory cell 250 illustrated in FIGS. 10A and 10B. FIG. 12A and FIG. 12B are a top view and a cross-sectional view of the semiconductor device, respectively. Here, FIG. 12B corresponds to a cross section along line F1-F2 in FIG. 12A. Note that in FIG. 12A, some components of the semiconductor device illustrated in FIG. 12B are omitted for clarity.

A memory cell in FIGS. 12A and 12B includes the transistor 162 in which a channel is formed in an oxide semiconductor layer and the capacitor 254. The structure of the transistor 162 is similar to that of the transistors 162 illustrated in FIGS. 8A and 8B; thus, detailed description thereof is omitted here.

In FIGS. 12A and 12B, the capacitor 254 includes the electrode layer 143b, the oxide semiconductor layer 144, the insulating layer 173, and the conductive layer 174. The conductive layer 174 is formed in the same step as the gate electrode layer 148, and a top surface of the conductive layer 174 is covered with the insulating film 176 and side surfaces of the conductive layer 174 are covered with the sidewall insulating layers 175a and 175b.

By introducing an impurity element into the oxide semiconductor layer 144 using the gate electrode layer 148 and the conductive layer 174 as masks, low-resistance regions are formed in a self-aligned manner in a region of the oxide semiconductor layer 144 which does not overlap with the gate electrode layer 148 and the conductive layer 174. The electrode layers 142a and 142b functioning as a source electrode layer and a drain electrode layer are in contact with the low-resistance regions of the oxide semiconductor layer 144 and function as a source region and a drain region of the transistor 162; thus, the contact resistance between the oxide semiconductor layer 144 and each of the source and drain electrode layers can be reduced.

The electrode layer 142b of the transistor 162 is electrically connected to a wiring 260 in an opening which is formed in the insulating layer 135 and the insulating layer 150 and reaches the electrode layer 142b.

Figure 13A:
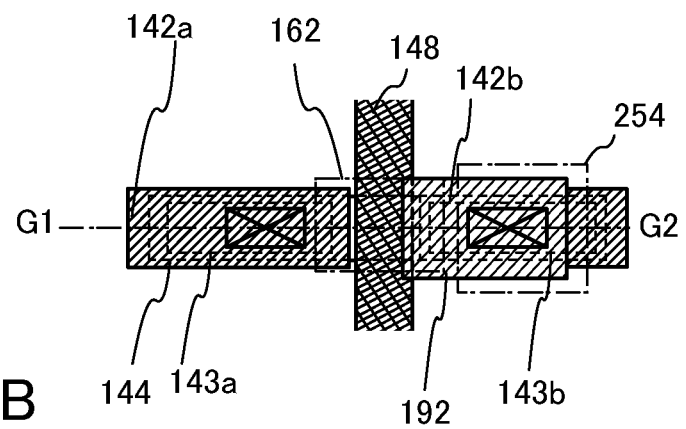
FIGS. 13A and 13B are a top view and a cross-sectional view, respectively, illustrating one embodiment of a semiconductor device.
Figure 13B:
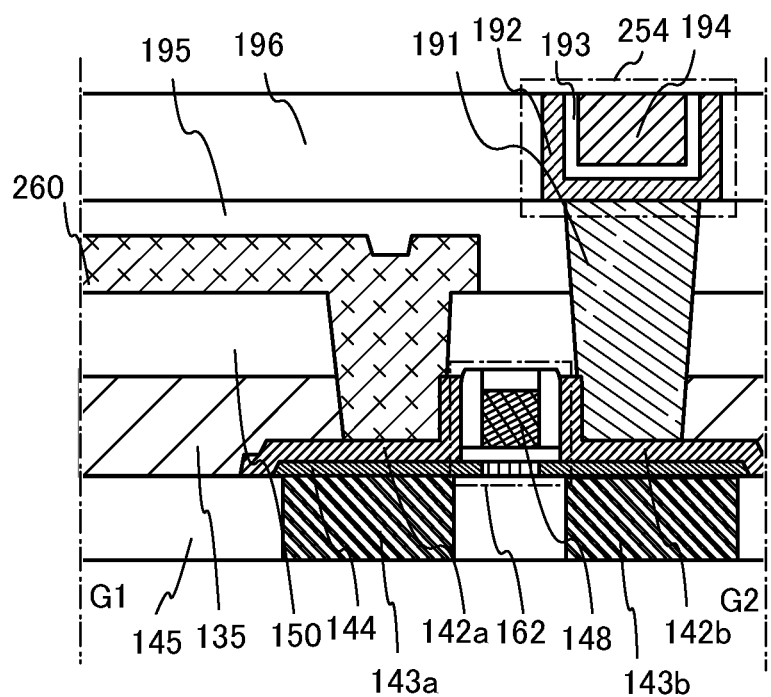

FIG. 13A and FIG. 13B are a top view and a cross-sectional view of the semiconductor device, respectively. Here, FIG. 13B corresponds to a cross section along line G1-G2 in FIG. 13A. Note that in FIG. 13A, some components of the semiconductor device illustrated in FIG. 13B are omitted for clarity.

The memory cell in FIGS. 13A and 13B includes the transistor 162 in which a channel is formed in an oxide semiconductor layer and the capacitor 254. The structure of the transistor 162 is similar to that of the transistors 162 illustrated in FIGS. 8A and 8B; thus, detailed description thereof is omitted here.

In FIGS. 13A and 13B, the capacitor 254 includes a conductive layer 192, an insulating layer 193, and a conductive layer 194, and is formed in an insulating film 196. Note that an insulating material having high dielectric constant is preferably used for the insulating layer 193. The capacitor 254 and the transistor 162 are electrically connected to each other through a conductive layer 191 provided in the opening which is formed in the interlayer insulating layer 135, the insulating layer 150, and an insulating film 195 and reaches the electrode layer 142b of the transistor 162.

By introducing an impurity element into the oxide semiconductor layer 144 using the gate electrode layer 148 as a mask, low-resistance regions are formed in a self-aligned manner in a region of the oxide semiconductor layer 144 which does not overlap with the gate electrode layer 148. The electrode layers 142a and 142b functioning as a source electrode layer and a drain electrode layer are in contact with the low-resistance regions of the oxide semiconductor layer 144 and function as a source region and a drain region of the transistor 162; thus, the contact resistance between the oxide semiconductor layer 144 and each of the source and drain electrode layers can be reduced.

As illustrated in FIGS. 12A and 12B and FIGS. 13A and 13B, the transistor 162 and the capacitor 254 are closely stacked to overlap with each other, whereby the occupied area of the semiconductor device can be decreased; thus, the semiconductor device can be highly integrated.

As described above, the plurality of memory cells formed in the upper portion of the semiconductor device includes the transistors including an oxide semiconductor. Since the off-state current of the transistor including an intrinsic oxide semiconductor which is highly purified is small, stored data can be held for a long time with the use of such a transistor. In other words, the frequency of the refresh operation can be extremely lowered, which leads to a sufficient reduction in power consumption.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor whose off-state current is sufficiently small). In addition, with a structure where the peripheral circuit and the memory circuit are stacked, the degree of integration of the semiconductor device can be increased.

In the transistor 162 described in this embodiment, the electrode layer is formed under and in contact with the oxide semiconductor layer, and treatment for introducing an impurity element into the oxide semiconductor layer using the gate electrode layer as a mask is performed. Thus, the transistor 162 can have favorable electrical characteristics and off-state current can be sufficiently reduced. Further, with the use of such a transistor, a semiconductor device in which stored data can be stored for an extremely long time can be obtained.

The transistor described above has high on-state characteristics (e.g., on-state current) and is capable of high-speed operation and high-speed response. Further, the transistor can be miniaturized. Accordingly, with the use of the transistor, a high-performance, highly reliable semiconductor device can be provided.

This embodiment can be implemented in appropriate combination with the structures described in the other embodiments.

(Embodiment 5)

In this embodiment, examples of application of the semiconductor device described in any of the above embodiments to portable devices such as cellular phones, smartphones, or e-book readers are described with reference to FIGS. 14A and 14B, FIG. 15, FIG. 16, and FIG. 17.

In portable devices such as a mobile phone, a smartphone, and an e-book reader, an SRAM or a DRAM is used so as to store image data temporarily. An SRAM or a DRAM is used because a flash memory, whose response is slow, is unsuitable to be used for image processing. On the other hand, an SRAM or a DRAM has the following characteristics when used for temporary storage of image data.

Figure 14A:
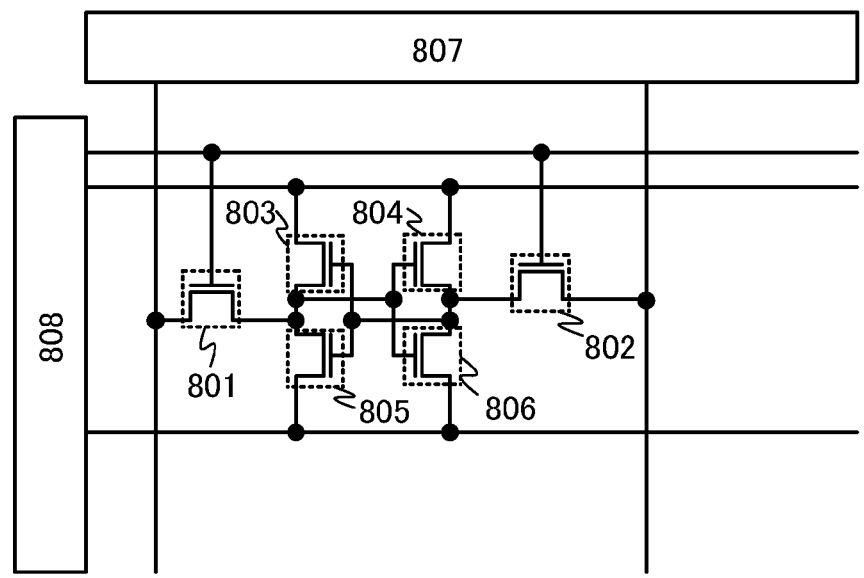
FIGS. 14A and 14B are circuit diagrams each illustrating one embodiment of a semiconductor device.

In an ordinary SRAM, as illustrated in FIG. 14A, one memory cell includes six transistors, that is, transistors 801 to 806, which are driven with an X decoder 807 and a Y decoder 808. The transistors 803 and 805 and the transistors 804 and 806 each serve as an inverter, and high-speed driving can be performed therewith. However, an SRAM has a disadvantage of large cell area because one memory cell includes six transistors. Provided that the minimum feature size of a design rule is F, the area of a memory cell in an SRAM is generally 100 $F^2$ to 150 $F^2$. Therefore, a price per bit of an SRAM is expensive.

Figure 14B:
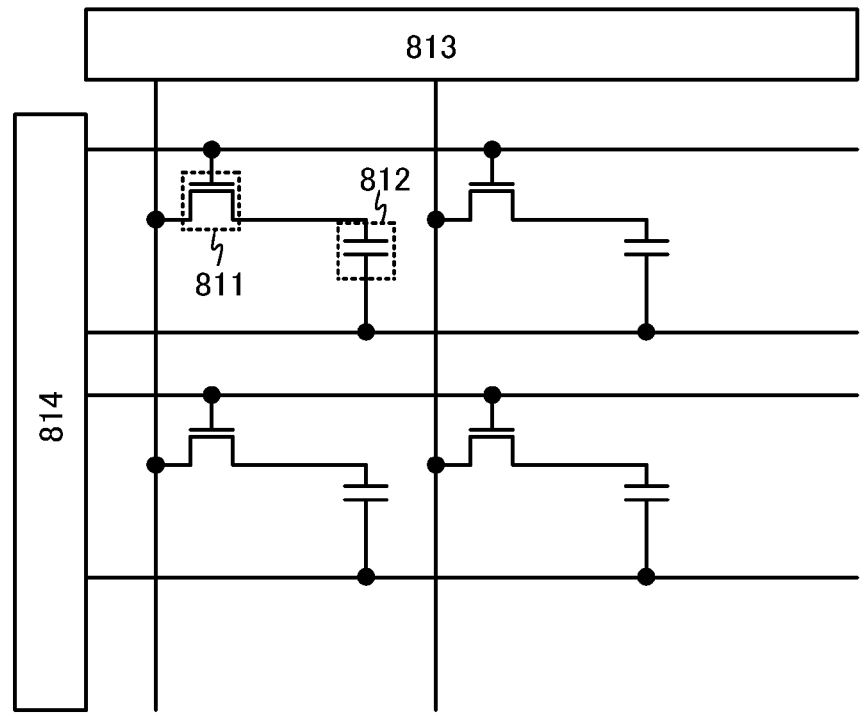

On the other hand, as illustrated in FIG. 14B, a memory cell in a DRAM includes a transistor 811 and a storage capacitor 812, and is driven by an X decoder 813 and a Y decoder 814. One cell includes one transistor and one capacitor and thus the area of a memory cell is small. The area of a memory cell of a DRAM is generally less than or equal to 10 $F^2$. Note that the DRAM needs to be refreshed periodically and consumes electric power even when a rewriting operation is not performed.

However, the area of the memory cell of the semiconductor device described in the above embodiments is about 10 $F^2$ and frequent refreshing is not needed. Therefore, the area of a memory cell can be decreased, and power consumption can be reduced.

Figure 15:
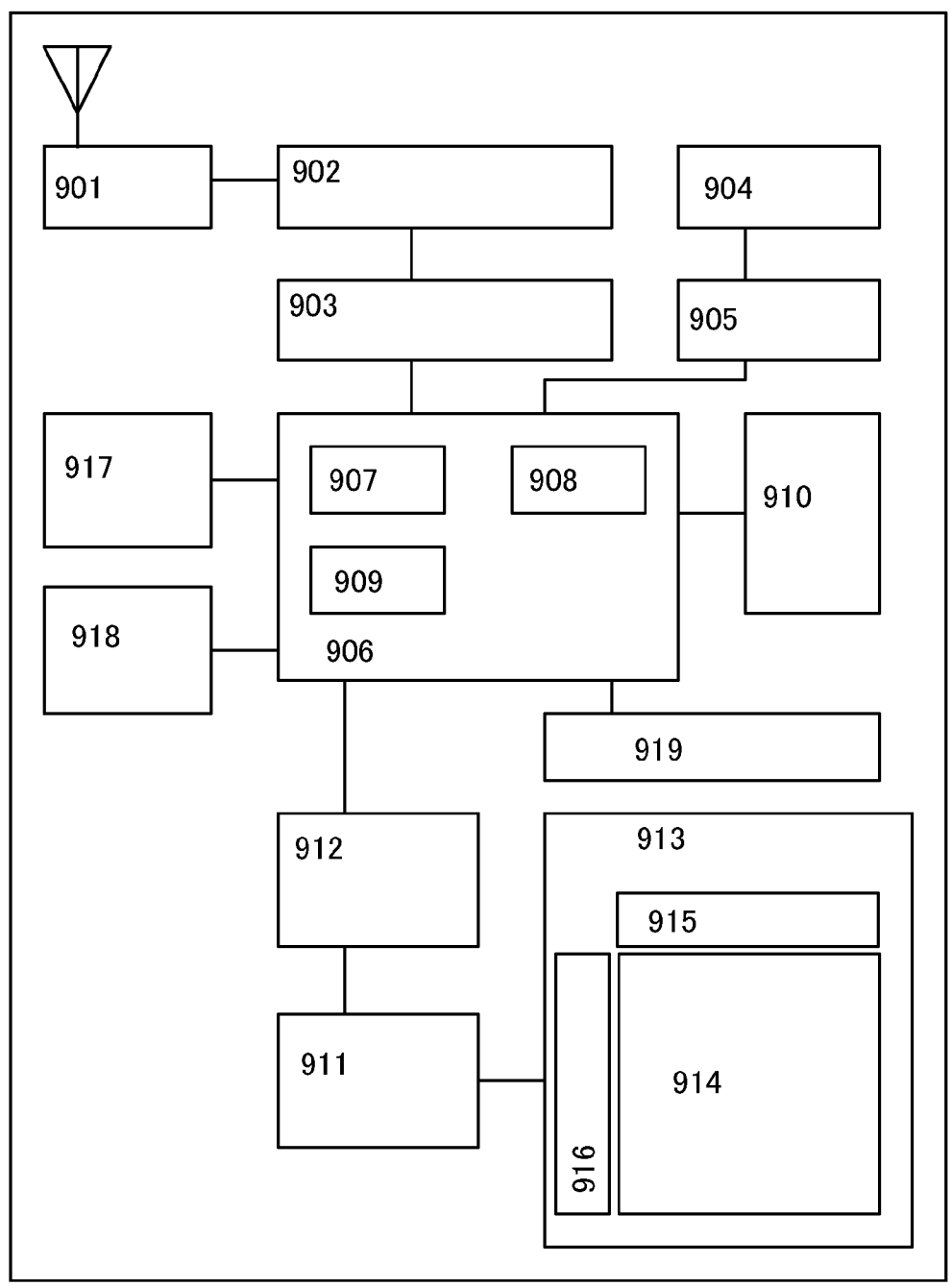
FIG. 15 is a block diagram illustrating one embodiment of a semiconductor device.

Next, a block diagram of a portable device is illustrated in FIG. 15. The portable device illustrated in FIG. 15 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface (IF) 909. In general, the memory circuit 912 includes an SRAM or a DRAM; by employing the semiconductor device described in any of the above embodiments for the memory circuit 912, it is possible to provide a portable device in which writing and reading of data can be performed at high speed, data can be held for a long time, and power consumption can be sufficiently reduced.

Figure 16:
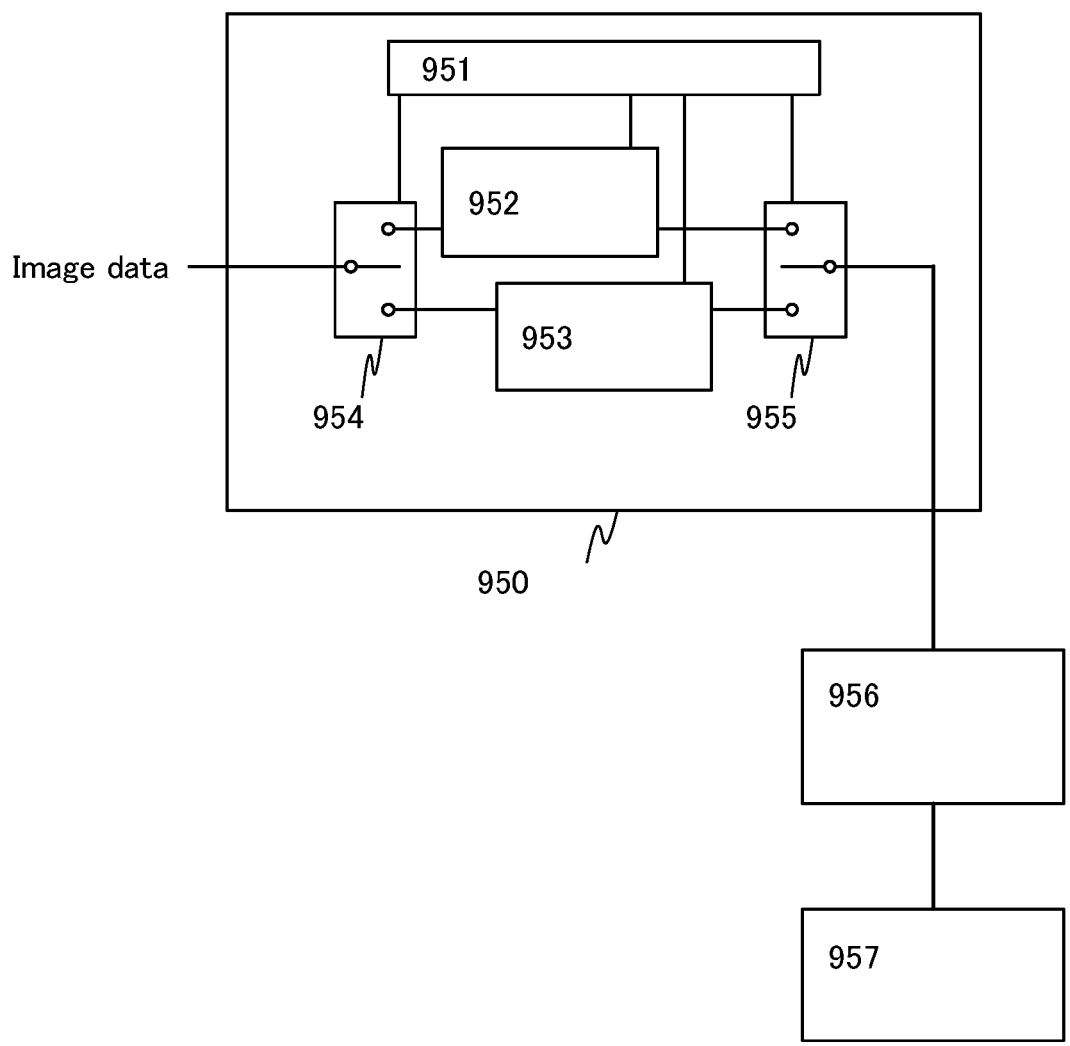
FIG. 16 is a block diagram illustrating one embodiment of a semiconductor device.

FIG. 16 illustrates an example of using the semiconductor device described in any of the above embodiments in a memory circuit 950 for a display. The memory circuit 950 illustrated in FIG. 16 includes a memory 952, a memory 953, a switch 954, a switch 955, and a memory controller 951. The memory circuit 950 is connected to a display controller 956 that reads and controls image data input through a signal line (input image data) and data stored in the memory 952 and the memory 953 (stored image data), and is also connected to a display 957 that displays an image based on a signal input from the display controller 956.

First, image data (input image data A) is formed by an application processor (not shown). The input image data A is stored in the memory 952 through the switch 954. The image data (stored image data A) stored in the memory 952 is transmitted and displayed to the display 957 through the switch 955 and the display controller 956.

In the case where the input image data A is not changed, the stored image data A is read from the memory 952 through the switch 955 by the display controller 956 normally at a frequency of approximately 30 Hz to 60 Hz.

Next, for example, when data displayed on the screen is rewritten by a user (that is, in the case where the input image data A is changed), new image data (input image data B) is formed by the application processor. The input image data B is stored in the memory 953 through the switch 954. The stored image data A is read periodically from the memory 952 through the switch 955 even during that time. After the completion of storing the new image data (stored image data B) in the memory 953, from the next frame for the display 957, the stored image data B starts to be read, transmitted to the display 957 through the switch 955 and the display controller 956, and displayed on the display 957. This reading operation is continued until another new image data is stored in the memory 952.

By alternately writing and reading image data to and from the memory 952 and the memory 953 as described above, images are displayed on the display 957. The memories 952 and 953 are not necessarily different memories, and a memory region included in one memory may be divided to be used. By employing the semiconductor device described in any of the above embodiments for the memory 952 and the memory 953, data can be written and read at high speed and held for a long time, and power consumption can be sufficiently reduced.

Figure 17:
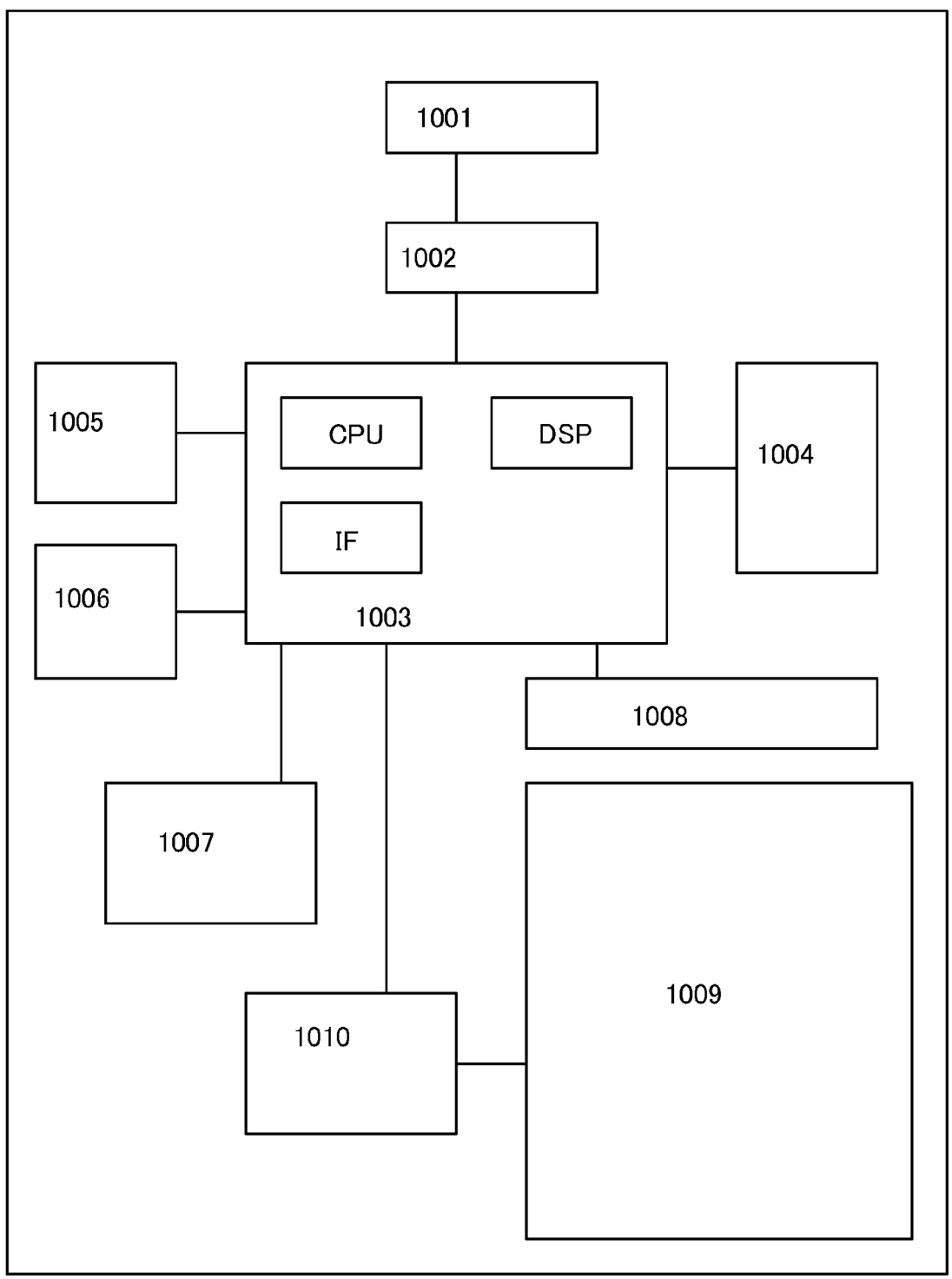
FIG. 17 is a block diagram illustrating one embodiment of a semiconductor device.

Next, a block diagram of an e-book reader is illustrated in FIG. 17. The e-book reader in FIG. 17 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 17. The memory circuit 1007 has a function of temporarily holding the contents of a book. For example, when a user uses a highlight function, the memory circuit 1007 stores and holds data of a portion specified by the user. Note that the highlight function is used to make a difference between a specific portion and the other portions while reading an e-book, by marking the specific portion, e.g., by changing the display color, underlining, making characters bold, changing the font of characters, or the like. In order to store the data for a short time, the data may be stored in the memory circuit 1007. In order to store the data for a long time, the data stored in the memory circuit 1007 may be copied to the flash memory 1004. Also in such a case, by employing the semiconductor device described in any of the above embodiments, data can be written and read at high speed and held for a long time, and power consumption can be sufficiently reduced.

As described above, the semiconductor device in any of the above embodiments is mounted on each of the portable devices described in this embodiment. Therefore, a portable device in which writing and reading of data are performed at high speed, data is held for a long time, and power consumption is sufficiently reduced, can be obtained.

The structures, methods, and the like described in this embodiment can be combined as appropriate with any of the structures, methods, and the like described in the other embodiments.

This application is based on Japanese Patent Application serial No. 2011-226135 filed with Japan Patent Office on Oct. 13, 2011, the entire contents of which are hereby incorporated by reference.

What is claimed is:

1. A semiconductor device comprising:
a first electrode layer and a second electrode layer;
an oxide semiconductor layer over the first electrode layer and the second electrode layer, wherein the oxide semiconductor layer includes a first region electrically connected to the first electrode layer, a second region electrically connected to the second electrode layer, and a channel formation region between the first region and the second region;
a gate insulating layer over the oxide semiconductor layer;
a gate electrode layer over the gate insulating layer, wherein the gate electrode layer overlaps with the channel formation region;
a first insulating layer over the gate electrode layer;
sidewall insulating layers covering side surfaces of the gate electrode layer and side surfaces of the first insulating layer;
a source electrode layer and a drain electrode layer which are in contact with the oxide semiconductor layer, side surfaces of the gate insulating layer, and side surfaces of the sidewall insulating layer;
a second insulating layer over the source electrode layer and the drain electrode layer;
a third insulating layer over the first insulating layer, the sidewall insulating layers, the source electrode layer, the drain electrode layer, and the second insulating layer; and
a first wiring layer electrically connected to the first region through a first opening and a second wiring layer electrically connected to the second region through a second opening, wherein the first opening and the second opening are formed in the second insulating layer and the third insulating layer, and
wherein heights of top surfaces of the source electrode layer and the drain electrode layer are lower than heights of top surfaces of the first insulating layer, the sidewall insulating layer, and the second insulating layer, and are higher than a height of a top surface of the gate electrode layer.

2. The semiconductor device according to claim 1, wherein the first electrode layer and the second electrode layer are provided in a base insulating layer, and top surfaces of the first electrode layer and the second electrode layer are exposed from the base insulating layer.

3. The semiconductor device according to claim 1, wherein a thickness of the first electrode layer and the second electrode layer is greater than a thickness of the oxide semiconductor layer.

4. The semiconductor device according to claim 1, wherein the first electrode layer and the second electrode layer are formed in contact with a top surface of a base insulating layer.

5. The semiconductor device according to claim 1, wherein the second insulating layer comprises an aluminum oxide layer in contact with the source electrode layer and the drain electrode layer.

6. The semiconductor device according to claim 1, wherein a surface on which the channel formation region is to be formed has planarity.

7. The semiconductor device according to claim 1,
wherein the first wiring layer overlaps with the first electrode layer, and
wherein the second wiring layer overlaps with the second electrode layer.

8. The semiconductor device according to claim 1,
wherein the first wiring layer is electrically connected to the first region through the source electrode layer, and
wherein the second wiring layer is electrically connected to the second region through the drain electrode layer.

9. The semiconductor device according to claim 1, wherein a resistance of the first region and a resistance of the second region are lower than a resistance of the channel formation region.

10. A semiconductor device comprising:
a first electrode layer and a second electrode layer;
an oxide semiconductor layer over the first electrode layer and the second electrode layer, wherein the oxide semiconductor layer includes a first region electrically connected to the first electrode layer, a second region electrically connected to the second electrode layer, and a channel formation region between the first region and the second region;
a gate insulating layer over the oxide semiconductor layer;
a gate electrode layer over the gate insulating layer, wherein the gate electrode layer overlaps with the channel formation region;
sidewall insulating layers covering side surfaces of the gate electrode layer;
a source electrode layer and a drain electrode layer which are in contact with the oxide semiconductor layer, side surfaces of the gate insulating layer, and side surfaces of the sidewall insulating layer;
a first insulating layer over the source electrode layer and the drain electrode layer;
a second insulating layer over and in contact with the gate electrode layer, the sidewall insulating layers, the source electrode layer, the drain electrode layer, and the first insulating layer; and
a first wiring layer electrically connected to the first region through a first opening and a second wiring layer electrically connected to the second region through a second opening, wherein the first opening and the second opening are formed in the first insulating layer and the second insulating layer.

11. The semiconductor device according to claim 10, wherein the first electrode layer and the second electrode layer are provided in a base insulating layer, and top surfaces of the first electrode layer and the second electrode layer are exposed from the base insulating layer.

12. The semiconductor device according to claim 10, wherein a thickness of the first electrode layer and the second electrode layer is greater than a thickness of the oxide semiconductor layer.

13. The semiconductor device according to claim 10, wherein the first electrode layer and the second electrode layer are formed in contact with a top surface of a base insulating layer.

14. The semiconductor device according to claim 10, wherein the second insulating layer comprises an aluminum oxide layer in contact with the source electrode layer and the drain electrode layer.

15. The semiconductor device according to claim 10, wherein a surface on which the channel formation region is to be formed has planarity.

16. The semiconductor device according to claim 10,
wherein the first wiring layer overlaps with the first electrode layer, and
wherein the second wiring layer overlaps with the second electrode layer.

17. The semiconductor device according to claim 10,
wherein the first wiring layer is electrically connected to the first region through the source electrode layer, and
wherein the second wiring layer is electrically connected to the second region through the drain electrode layer.

18. The semiconductor device according to claim 10, wherein a resistance of the first region and a resistance of the second region are lower than a resistance of the channel formation region.

* * * * *